(12) United States Patent
Honjo

(10) Patent No.: US 12,550,394 B2
(45) Date of Patent: Feb. 10, 2026

(54) SEMICONDUCTOR DEVICE AND ELECTRONIC APPARATUS THAT ARE CAPABLE OF INCREASING THE EFFECTIVE CHANNEL WIDTH

(71) Applicant: SONY SEMICONDUCTOR SOLUTIONS CORPORATION, Kanagawa (JP)

(72) Inventor: Akiko Honjo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 372 days.

(21) Appl. No.: 18/007,023

(22) PCT Filed: Jun. 14, 2021

(86) PCT No.: PCT/JP2021/022532
§ 371 (c)(1),
(2) Date: Jan. 26, 2023

(87) PCT Pub. No.: WO2022/030110
PCT Pub. Date: Feb. 10, 2022

(65) Prior Publication Data
US 2023/0299140 A1    Sep. 21, 2023

(30) Foreign Application Priority Data

Aug. 6, 2020   (JP) ................. 2020-134184

(51) Int. Cl.
*H10D 62/17*      (2025.01)
*H10D 30/01*      (2025.01)
(Continued)

(52) U.S. Cl.
CPC ....... *H10D 62/235* (2025.01); *H10D 30/0227* (2025.01); *H10D 30/601* (2025.01);
(Continued)

(58) Field of Classification Search
CPC .............. H10D 30/204; H10D 62/292; H10D 84/0128; H10D 84/0167; H10D 30/014;
(Continued)

(56) References Cited

U.S. PATENT DOCUMENTS 4,403,237 A * 9/1983 Ohkubo ............... H10D 44/474
                                                    257/E29.058
4,910,576 A * 3/1990 Campbell ............. G11C 11/412
                                                         257/524
(Continued)

FOREIGN PATENT DOCUMENTS

JP    2007-027176    2/2007
JP    2010-165854    7/2010
(Continued)

OTHER PUBLICATIONS

International Search Report and Written Opinion prepared by the Japan Patent Office on Aug. 16, 2021, for International Application No. PCT/JP2021/022532, 2 pgs.

*Primary Examiner* — Maliheh Malek
(74) *Attorney, Agent, or Firm* — SHERIDAN ROSS P.C.

(57) ABSTRACT

An effective channel width is expanded. A semiconductor device includes: a semiconductor layer having an active region demarcated by a separation region; and a field-effect transistor in which a pair of main electrode regions sandwiching a channel region are provided in the active region and a gate electrode is provided on the channel region. The active region has a first portion extending in one direction in plan view and a second portion extending from the first portion in a direction crossing the one direction, and the channel region is provided across the first portion and the second portion. One of the pair of main electrode regions is provided in the first region in contact with the channel region, and the other is provided in the second region in (Continued)

contact with the channel region, the pair of main electrode regions being positioned on mutually opposite sides sandwiching the channel region.

16 Claims, 25 Drawing Sheets

(51) Int. Cl.
  *H10D 30/60* (2025.01)
  *H10D 62/10* (2025.01)
  *H10D 64/27* (2025.01)
  *H10D 84/83* (2025.01)
  *H10F 39/00* (2025.01)

(52) U.S. Cl.
  CPC ......... *H10D 62/126* (2025.01); *H10D 64/518* (2025.01); *H10D 64/519* (2025.01); *H10D 84/83* (2025.01); *H10F 39/80377* (2025.01)

(58) Field of Classification Search
  CPC .......... H10D 30/019–0198; H10D 30/43–435; H10D 30/501–509; H10D 30/63; H10D 84/016; H10D 84/0195; H10D 30/027–0278; H10D 30/47; H10D 30/481–485; H10D 86/421–427; H10D 86/0221–0229; H10K 10/491; H10B 63/34
  See application file for complete search history.

(56) References Cited

U.S. PATENT DOCUMENTS

| | | | | |
|---|---|---|---|---|
| 5,886,388 A * | 3/1999 | Wada | ............... | H10D 86/01 257/E27.099 |
| 6,320,780 B1 * | 11/2001 | Mueller | ............... | H10B 12/30 365/189.08 |
| 6,373,107 B1 * | 4/2002 | Nikaido | ............... | H10B 10/12 257/E27.099 |
| 6,577,021 B2 * | 6/2003 | Morishima | ............... | H10B 10/12 257/213 |
| 6,794,718 B2 * | 9/2004 | Nowak | ............... | H10D 84/0167 438/149 |
| 6,900,503 B2 * | 5/2005 | Oh | ............... | H10B 10/12 257/350 |
| 6,940,106 B2 * | 9/2005 | Shino | ............... | H10D 86/201 257/E27.099 |
| 7,230,287 B2 * | 6/2007 | Anderson | ............... | H10D 84/0167 257/E21.639 |
| 7,312,485 B2 * | 12/2007 | Armstrong | ............... | H10D 30/795 438/50 |
| 7,602,456 B2 * | 10/2009 | Tanaka | ............... | H10D 86/60 349/42 |
| 7,667,244 B2 * | 2/2010 | Narita | ............... | H10D 84/0186 257/351 |
| 7,759,179 B2 * | 7/2010 | Anderson | ............... | H10D 86/011 438/164 |
| 7,786,529 B2 * | 8/2010 | Kim | ............... | H10D 84/0149 257/E29.112 |
| 7,816,198 B2 * | 10/2010 | Ostermayr | ............... | H10D 84/038 257/E29.345 |
| 8,138,035 B2 * | 3/2012 | Xiong | ............... | H10D 62/405 438/266 |
| 8,405,159 B2 * | 3/2013 | Adachi | ............... | H10B 10/12 257/E27.098 |
| 8,629,477 B2 * | 1/2014 | Lochtefeld | ............... | H10F 77/16 257/190 |
| 9,053,966 B2 * | 6/2015 | Xiong | ............... | H10D 84/0193 |
| 9,634,122 B2 * | 4/2017 | Hsiao | ............... | H01L 21/76224 |
| 10,068,922 B2 * | 9/2018 | Leobandung | ............... | H01L 21/0337 |
| 10,262,998 B2 * | 4/2019 | Sagong | ............... | H10D 84/856 |
| 10,727,251 B2 * | 7/2020 | Dünkel | ............... | H10B 51/30 |
| 10,930,740 B2 * | 2/2021 | Jung | ............... | H10D 84/834 |
| 11,342,327 B2 * | 5/2022 | Pillarisetty | ............... | H10D 84/038 |
| 12,148,814 B2 * | 11/2024 | Vellianitis | ............... | H01L 21/02609 |
| 2003/0102518 A1 * | 6/2003 | Fried | ............... | H10B 10/00 257/350 |
| 2004/0119100 A1 * | 6/2004 | Nowak | ............... | H10D 84/0193 438/129 |
| 2005/0001290 A1 * | 1/2005 | Chan | ............... | H10D 84/0167 257/369 |
| 2005/0199913 A1 * | 9/2005 | Hofmann | ............... | H10B 69/00 438/257 |
| 2005/0285150 A1 * | 12/2005 | Birner | ............... | H10D 84/0167 257/E21.546 |
| 2006/0237785 A1 * | 10/2006 | Ieong | ............... | H10D 84/038 257/338 |
| 2007/0241400 A1 * | 10/2007 | Nagai | ............... | H10D 62/405 257/E29.004 |
| 2007/0269936 A1 * | 11/2007 | Tanaka | ............... | H10D 86/441 257/E21.02 |
| 2007/0284582 A1 * | 12/2007 | Saito | ............... | H10D 86/201 257/66 |
| 2008/0303100 A1 * | 12/2008 | Narita | ............... | H10D 84/0172 257/369 |
| 2009/0014806 A1 * | 1/2009 | Ostermayr | ............... | H10D 84/038 257/E29.345 |
| 2010/0177226 A1 * | 7/2010 | Itonaga | ............... | H10F 39/18 348/300 |
| 2013/0056799 A1 * | 3/2013 | Ishizu | ............... | H10D 89/10 716/136 |
| 2014/0015024 A1 * | 1/2014 | Shimomura | ............... | H10F 39/813 257/292 |
| 2015/0115392 A1 * | 4/2015 | Yoon | ............... | H10B 12/09 257/499 |
| 2016/0133522 A1 * | 5/2016 | Kang | ............... | H01L 21/76816 438/283 |
| 2017/0141113 A1 * | 5/2017 | Sagong | ............... | H10D 84/0167 |
| 2018/0182722 A1 * | 6/2018 | Kim | ............... | H10B 12/488 |
| 2020/0105994 A1 * | 4/2020 | Leipold | ............... | H10D 48/3835 |
| 2020/0119031 A1 * | 4/2020 | Shen | ............... | H10B 41/35 |
| 2020/0176456 A1 * | 6/2020 | Dünkel | ............... | H10D 64/518 |
| 2020/0303504 A1 * | 9/2020 | Jung | ............... | H10D 84/038 |
| 2021/0408026 A1 * | 12/2021 | Shen | ............... | H10B 41/41 |
| 2022/0399337 A1 * | 12/2022 | Mahalingam | ............... | H10D 30/603 |
| 2023/0197640 A1 * | 6/2023 | Wu | ............... | H10D 64/017 257/401 |
| 2024/0266372 A1 * | 8/2024 | Shirahige | ............... | H10F 39/80377 |
| 2025/0107177 A1 * | 3/2025 | Raghavan | ............... | H10D 64/017 |
| 2025/0155283 A1 * | 5/2025 | Ejiri | ............... | H04N 25/70 |

FOREIGN PATENT DOCUMENTS

| | | |
|---|---|---|
| JP | 2011-035260 | 2/2011 |
| JP | 2014-022463 | 2/2014 |

\* cited by examiner

SEMICONDUCTOR DEVICE AND ELECTRONIC APPARATUS THAT ARE CAPABLE OF INCREASING THE EFFECTIVE CHANNEL WIDTH

CROSS REFERENCE TO RELATED APPLICATIONS

This application is a national stage application under 35 U.S.C. 371 and claims the benefit of PCT Application No. PCT/JP2021/022532, having an international filing date of 14 Jun. 2021, which designated the United States, which PCT application claimed the benefit of Japanese Patent Application No. 2020-134184, filed 6 Aug. 2020, the entire disclosures of each of which are incorporated herein by reference.

TECHNICAL FIELD

The present technology (technology according to the present disclosure) relates to a semiconductor device and an electronic apparatus, and particularly to a technology effectively applied to a semiconductor device including a field-effect transistor and an electronic apparatus equipped with the semiconductor device.

BACKGROUND ART

A solid-state imaging device is known as a semiconductor device. This solid-state imaging device is equipped with a readout circuit for reading signal charges photoelectrically converted by a photoelectric conversion device. This readout circuit includes a plurality of transistors such as an amplifier transistor, a selection transistor, and a reset transistor. These transistors are formed in an active region demarcated by a separation region in a semiconductor layer.

In recent years, a technology for efficiently disposing transistors by reducing the transistor disposition region (area of the area) accompanying the miniaturization of pixels has been proposed. For example, Patent Literature 1 discloses a layout configuration in which a gate electrode of a transistor is disposed at a corner of an active region formed in an L-shape.

CITATION LIST

Patent Literature

Patent Literature 1: Japanese Patent Application Laid-open No. 2014-022463

DISCLOSURE OF INVENTION

Technical Problem

Incidentally, as shown in FIG. 3 of Patent Literature 1, in a transistor in which a gate electrode is disposed at a corner of an active region, since a channel region immediately below the gate electrode also has an L-shape, the length at the boundary between the inner side (side inside the corner) of the channel region and the separation region is shorter than the length at the boundary between the outer side (side outside the corner) of the channel region and the separation region. Meanwhile, a current tends to flow through a path in which the distance between a source region and a drain region is minimized. For this reason, the current tends to concentrate inside the channel region and the effective channel width (W) decreases. When the effective channel width decreases, the properties of a field-effect transistor deteriorate due to a short channel effect, and thus, there is a room for improvement from the viewpoint of reliability.

An object of the present technology is to provide a semiconductor device and an electronic apparatus that are capable of increasing the effective channel width (W).

Solution to Problem (1) A semiconductor device according to an aspect of the present technology includes: a semiconductor layer having an active region demarcated by a separation region; and a field-effect transistor in which a pair of main electrode regions sandwiching a channel region are provided in the active region and a gate electrode is provided on the channel region. Then, the active region has a first portion extending in one direction in plan view and a second portion extending from the first portion in a direction crossing the one direction, and the channel region is provided across the first portion and the second portion. Then, one of the pair of main electrode regions is provided in the first region in contact with the channel region, and the other is provided in the second region in contact with the channel region, the pair of main electrode regions being positioned on mutually opposite sides sandwiching the channel region.

(2) An electronic apparatus according to another aspect of the present technology includes: the semiconductor device according to (1) above; an optical lens that forms an image of image light from a subject on an imaging surface of the semiconductor device; and a signal processing circuit that performs signal processing on a signal output from the semiconductor device.

MODE(S) FOR CARRYING OUT THE INVENTION

Figure 1:
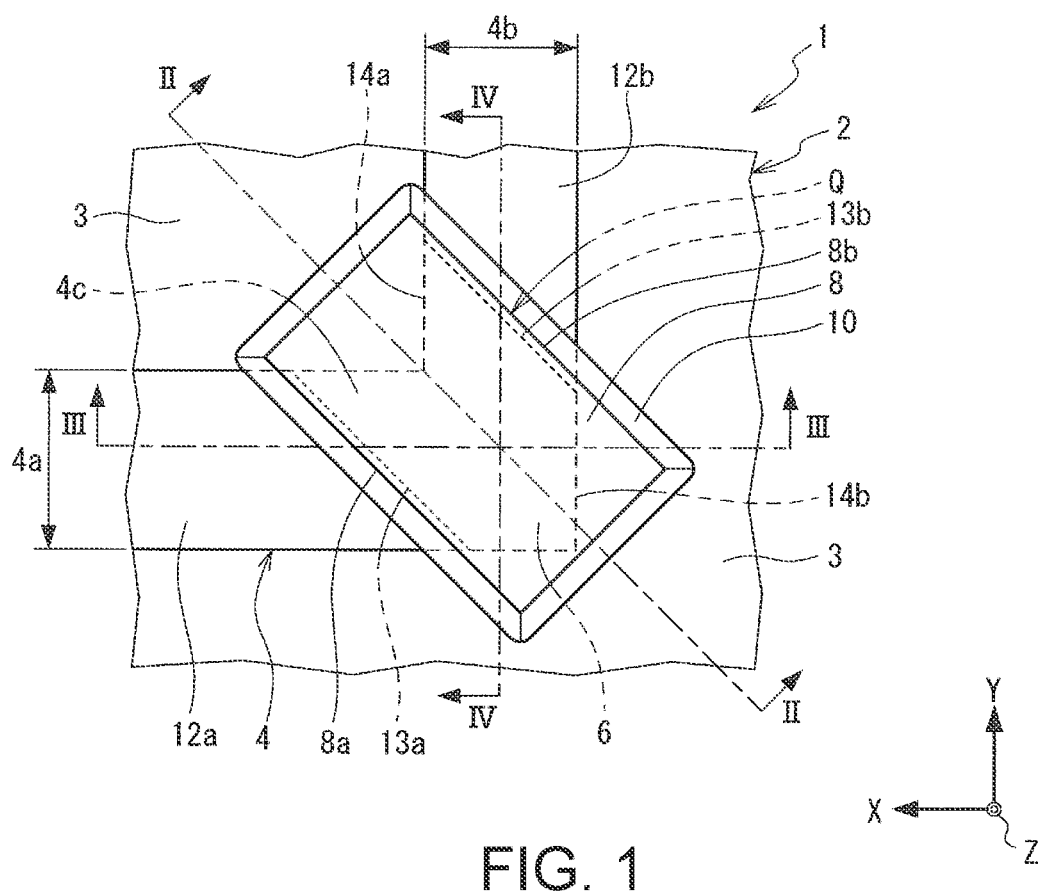
FIG. 1 is a schematic plan view of a main portion showing a configuration example of a semiconductor device according to a first embodiment of the present technology.
Figure 2:
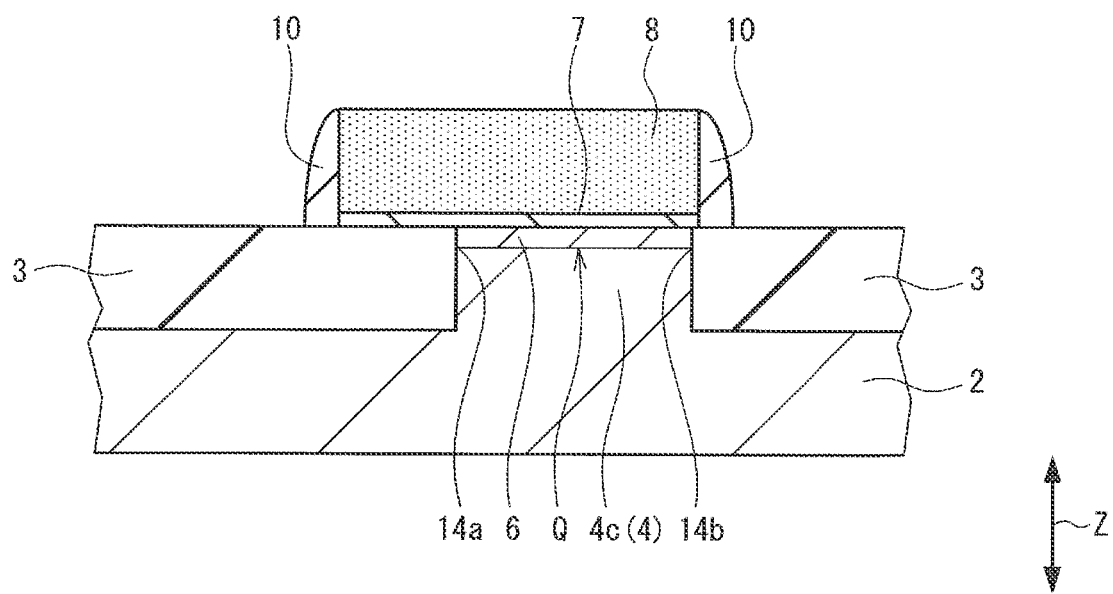
FIG. 2 is a schematic cross-sectional view showing a cross-sectional structure taken along the line II-II in FIG. 1.
Figure 3:
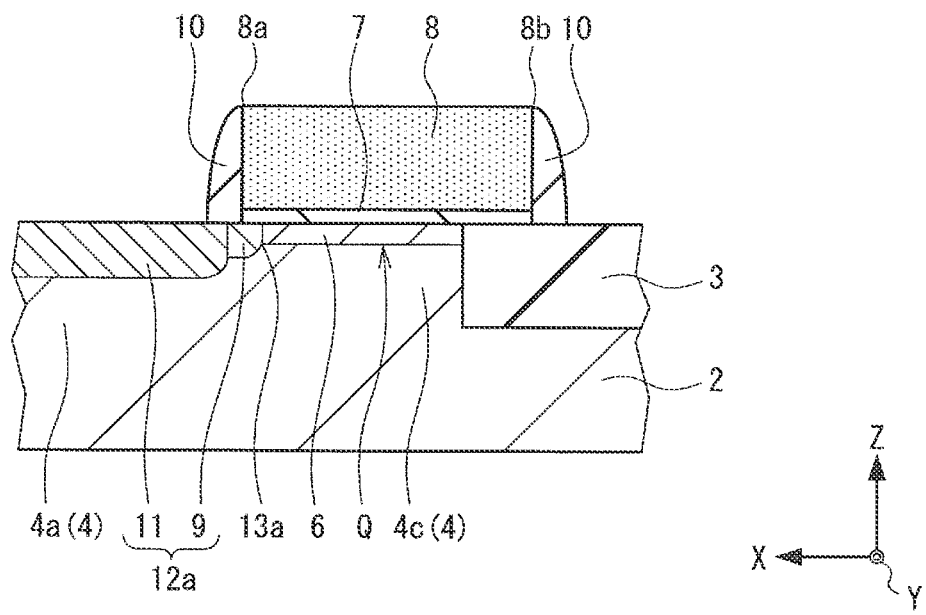
FIG. 3 is a schematic cross-sectional view showing a cross-sectional structure taken along the line III-III in FIG. 1.
Figure 4:
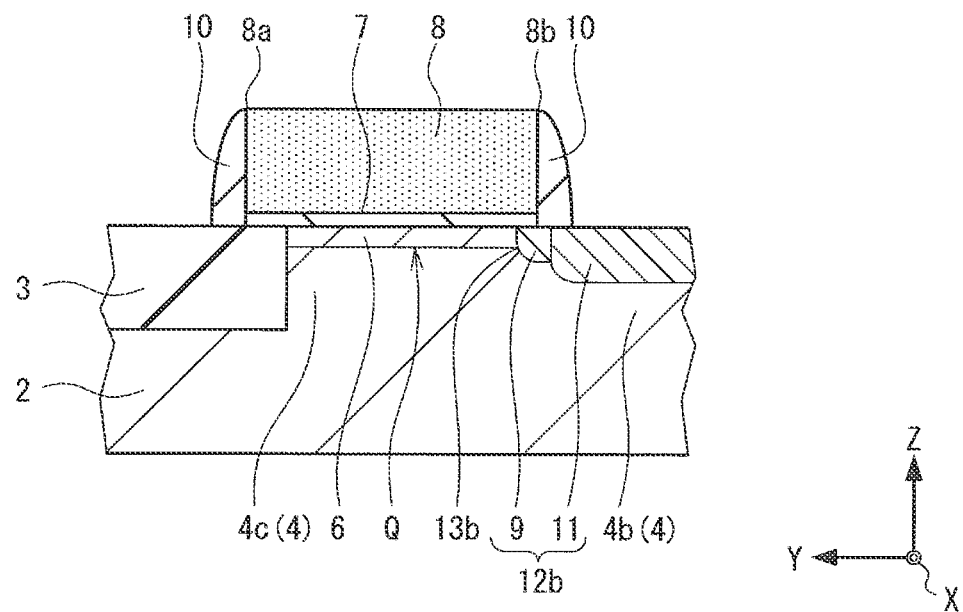
FIG. 4 is a schematic cross-sectional view showing a cross-sectional structure taken along the line IV-IV in FIG. 1.

Hereinafter, embodiments of the present technology will be described with reference to the drawings.

Note that in the drawings for describing the embodiment of the present technology, components having the same function will be denoted by the same reference symbols and repeated description thereof will be omitted.

Further, the respective drawings are schematic and differ from the actual ones in some cases. Further, the following embodiments illustrate devices and methods for embodying the technical idea of the present technology and do not specify the configurations as described below. That is, the technical idea of the present technology can be modified in various ways within the technical scope described in the claims.

Further, in the following embodiments, in three directions orthogonal to each other in space, a first direction and a second direction orthogonal to each other in the same plane will be respectively referred to as an X direction and a Y direction and a third direction orthogonal to the first direction and the second direction will be referred to as the Z direction. In the following embodiments, the thickness direction of a semiconductor layer (semiconductor substrate) will be described as the Z direction.

First Embodiment

In this first embodiment, an example in which the present technology is applied to a semiconductor device including a field-effect transistor will be described.

<<Configuration of Semiconductor Device>>

As shown in FIG. 1 to FIG. 4, a semiconductor device 1 according to the first embodiment of the present technology includes a semiconductor layer 2 having an active region 4 demarcated by a separation region 3, and a field-effect transistor Q in which a gate electrode 8 is disposed on this active region 4.

The field-effect transistor Q is, for example, of n-channel conductive type although not limited thereto. Then, the field-effect transistor Q includes a MOSFET (Metal Oxide Semiconductor field-effect transistor) using a silicon oxide film as a gate insulating film. The field-effect transistor Q may be of p-channel conductive type. Further, the field-effect transistor Q may include a MISFET (Metal Insulator Semiconductor FET) using, as a gate insulating film, a silicon nitride ($Si_3N_4$) film or a stacked film of a silicon nitride film and a silicon oxide film.

The field-effect transistor Q includes a gate insulating film 7 provided on the active region 4, the gate electrode 8 provided via the gate insulating film 7 above the active region 4, and a channel region 6 provided in the surface layer portion of the active region 4 immediately below the gate electrode 8. Further, the field-effect transistor Q further includes a sidewall spacer 10 provided on the side wall of the gate electrode 8 and a pair of main electrode regions 12a and 12b that are provided in the surface layer portion so as to be separated from each other in a channel length direction (gate length direction) sandwiching the channel region 6 and function as a source region and a drain region.

Further, the field-effect transistor Q further includes a first channel boundary portion 13a between the main electrode region 12a, which is one of the pair of main electrode regions 12a and 12b, and the channel region 6 and a second channel boundary portion 13b between the main electrode region 12b, which is the other of the pair of main electrode regions 12a and 12b, and the channel region 6.

Here, for convenience of description, of the pair of main electrode regions 12a and 12b, the one main electrode region 12a is referred to as a source region 12a and the other main electrode region 12b is referred to as a drain region 12b in some cases.

The semiconductor layer 2 includes, for example, a p-type semiconductor substrate formed of single crystal silicon. The channel region 6 includes, for example, a p-type semiconductor region (impurity diffusion region). The gate insulating film 7 includes, for example, a silicon oxide ($SiO_2$) film. The gate electrode 8 includes, for example, a polycrystalline silicon (doped polysilicon) film into which an impurity for reducing a resistance value is introduced.

Each of the pair of main electrode regions 12a and 12b includes an extension region 9 that is an n-type semiconductor region and a contact region 11 that is an n-type semiconductor region having an impurity concentration higher than that of this extension region 9. The extension region 9 is formed by self-alignment with respect to the gate electrode 8. The contact region 11 is formed by self-alignment with respect to the sidewall spacer 10 provided on the side wall of the gate electrode 8. The contact region 11 is provided for the purpose of reducing the ohmic contact resistance with a wire connected to the contact region 11.

The sidewall spacer 10 is formed of, for example, silicon oxide. The sidewall spacer 10 is formed by, for example, depositing an insulation film on the main surface of the semiconductor layer 2 by a CVD method so as to cover the gate electrode 8 and then applying dry etching to this insulation film.

The sidewall spacer 10 is formed by self-alignment with respect to the gate electrode 8. Therefore, each of the source region 12a and the drain region 12b including the extension region 9 and the contact region 11 is formed by self-alignment with respect to the gate electrode 8. Further, the first channel boundary portion 13a and the second channel boundary portion 13b are also formed by self-alignment with respect to the gate electrode 8.

The separation region 3 is formed by, for example, a well-known STI (Shallow Trench Isolation) technology although not limited thereto. The separation region 3 formed by this STI technology is formed by, for example, forming a shallow groove (e.g., a groove having a depth of approximately 300 nm) on the main surface of the semiconductor layer 2, forming an insulation film that includes, for example, a silicon oxide film on the entire main surface of the semiconductor layer 2 including the inner side of this shallow groove by a CVD (Chemical Vapor Deposition) method, and then planarizing the insulation film by a CMP (Chemical Mechanical Polishing) method such that the insulation film remains selectively inside the shallow groove. Alternatively, as another method of forming the separation region 3, the separation region 3 can be formed by a LOCOS (Local Oxidation of Silicon) method using a thermal oxidation method.

Figures 5, 6:
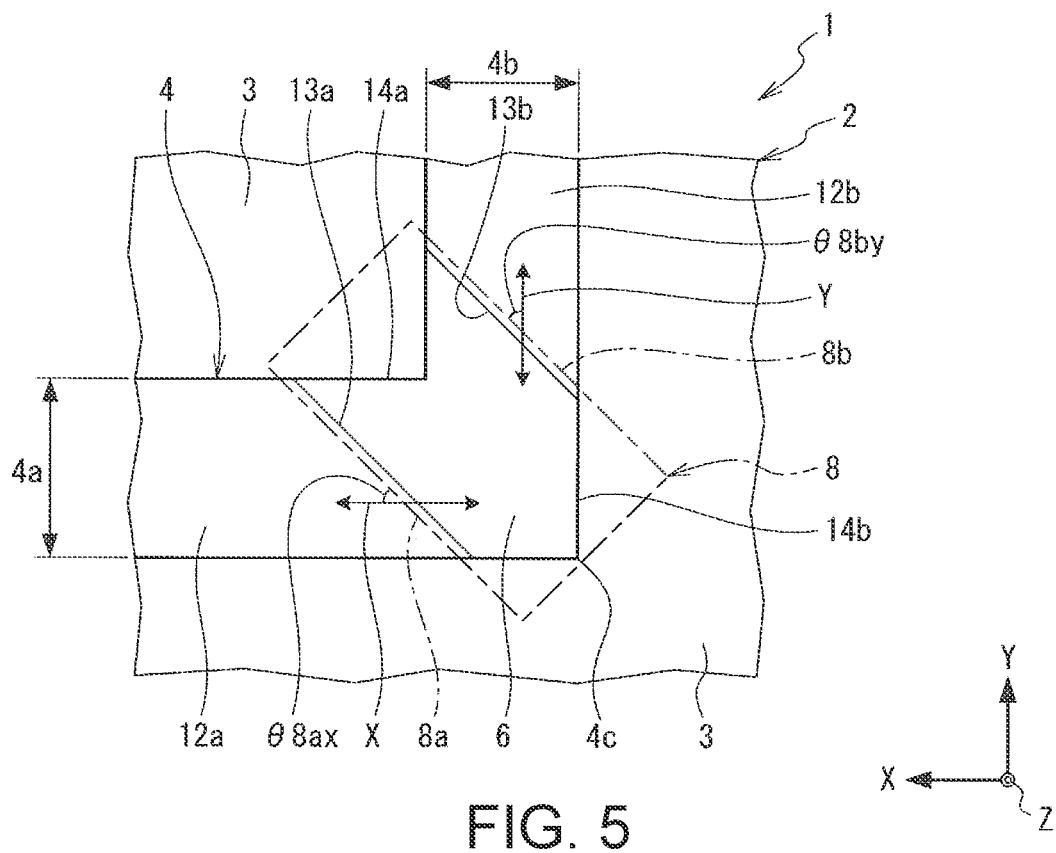
FIG. 5 is a diagram showing a positional relationship between an active region and a gate electrode.
FIG. 6 is a diagram showing a positional relationship between the active region and a channel boundary portion.

As shown in FIG. 5, the active region 4 includes a first portion 4a extending in one direction in plan view and a second portion 4b extending from this first portion 4a in a direction crossing the one direction. In this first embodiment, the first portion 4a extends in the X direction, of the X direction and the Y direction orthogonal to each other in the same plane, and the second portion 4b extends in the Y direction. Then, the first portion 4a and the second portion 4b are orthogonal to each other. That is, in the active region 4 in this first embodiment, the first portion 4a and the second portion 4b are connected to each other so as to relatively bend via a corner 4c. Then, the corner 4c has an L-shaped planar pattern.

As shown in FIG. 1 and FIG. 5, the gate electrode 8 of the field-effect transistor Q has a rectangular two-dimensional shape in plan view and is disposed at the corner 4c of the active region 4. Then, the gate electrode 8 includes a first side 8a crossing the first portion 4a of the active region 4 in plan view and a second side 8b that is positioned on the side opposite to this first side 8a and crosses the second portion 4b of the active region 4. Then, in this first embodiment, the first side 8a and the second side 8b extend parallel to each other and are inclined at an angle of 45 degrees with respect to the respective extending directions (the X direction and the Y direction) of the first portion 4a and the second portion 4b of the active region 4.

That is, in this first embodiment, since the first portion 4a and the second portion 4b of the active region 4 are orthogonal to each other, the first side 8a of the gate electrode 8 is inclined such that an inclination angle $\theta 8ax$ on the interior angle side formed with the extending direction (X direction) of the first portion 4a is 45 degrees. Further, the second side 8b of the gate electrode 8 is also inclined such that an inclination angle $\theta 8bx$ on the interior angle side formed with the extending direction (Y direction) of the second portion 4b is 45 degrees.

As shown in FIG. 1 and FIG. 6, in the field-effect transistor Q, one of the pair of main electrode regions 12a and 12b is provided in the first portion 4a of the active region 4 in contact with the channel region 6 and the other is provided in the second portion 4b of the channel region 6 in contact with the channel region 6, the pair of main electrode regions 12a and 12b being positioned on mutually opposite sides sandwiching the channel region 6. Then, in the field-effect transistor Q, the first channel boundary portion 13a and the second channel boundary portion 13b are positioned on mutually opposite sides sandwiching the channel region 6 in a superimposed region where the active region 4 and the gate electrode 8 are superimposed with each other (projection region of the gate electrode 8) in plan view. In other words, the first channel boundary portion 13a and the second channel boundary portion 13b face each other sandwiching the channel region 6.

As described above, the first channel boundary portion 13a is the boundary between the source region 12a and the channel region 6. More specifically, the first channel boundary portion 13a is the boundary between the extension region 9 of the source region 12a and the channel region 6. Then, the extension region 9 of the source region 12a is formed by self-alignment with respect to the side of the first side 8a of the gate electrode 8. Then, the extension region 9 of the source region 12a is formed in contact with the channel region 6. Therefore, the first channel boundary portion 13a is formed linearly following the shape of the first side 8a of the gate electrode 8 and is formed by self-alignment with respect to the side of the first side 8a of the gate electrode 8. Further, the first channel boundary portion 13a is inclined such that an inclination angle $\theta 13ax$ on the interior angle side formed with the extending direction (X direction) of the first portion 4a of the active region 4 is 45 degrees, similarly to the first side 8a of the gate electrode 8.

As described above, the second channel boundary portion 13b is the boundary between the drain region 12b and the channel region 6. More specifically, the second channel boundary portion 13b is the boundary between the extension region 9 of the drain region 12b and the channel region 6. Then, the extension region 9 of the drain region 12b is formed by self-alignment with respect to the side of the second side 8b of the gate electrode 8. Then, the extension region 9 of the drain region 12b is formed in contact with the channel region 6. Therefore, the second channel boundary portion 13b is formed linearly following the shape of the second side 8b of the gate electrode 8 and is formed by self-alignment with respect to the side of the second side 8b of the gate electrode 8. Further, the second channel boundary portion 13b is inclined such that an inclination angle θ13bx on the interior angle side formed with the extending direction (Y direction) of the second portion 4b of the active region 4 is 45 degrees, similarly to the second side 8b of the gate electrode 8.

As shown in FIG. 5, in the field-effect transistor Q, a length A1 of a channel region inner boundary portion 14a between the inner side of the channel region 6, which is one end side in the channel width direction, and the separation region 3 and a length B1 of a channel region outer boundary portion 14b between the outer side of the channel region 6, which is the other end side in the channel width direction, and the separation region 3 are equivalent to each other (A1=B1) in a superimposed region where the active region 4 and the gate electrode 8 are superimposed with each other (projection region of the gate electrode 8) in plan view. The length A1 of the channel region inner boundary portion 14a is defined by the inner side of each of the first channel boundary portion 13a and the second channel boundary portion 13b. The length B1 of the channel region outer boundary portion 14b is defined by the outer side of each of the first channel boundary portion 13a and the second channel boundary portion 13b.

Here, the inner side of the channel region 6 is the inner side of the L-shape formed by the first portion 4a and the second portion 4b of the active region 4, the interior angle side formed by the first portion 4a and the second portion 4b of the active region 4, and the inner side of the corner 4c of the active region 4. Further, the outer side of the channel region 6 is the outer side of the L-shape formed by the first portion 4a and the second portion 4b of the active region 4 and the outer side of the corner 4c of the active region 4.

In the field-effect transistor Q configured as described above, the distance between the source region 12a and the drain region 12b, more specifically, the distance between the extension region 9 of the source region 12a and the extension region 9 of the drain region 12b is the channel length (gate length). Then, in the field-effect transistor Q, a channel (inversion layer) that electrically connects the source region 12a and the drain region 12b to each other is formed (induced) in the channel region 6 by a voltage applied to the gate electrode 8 and a current (drain current) flows from the side of the drain region 12b to the side of the source region 12a through the channel region 6.

<<Method of Producing Semiconductor Device>>

Next, a method of producing a semiconductor device will be described with reference to FIG. 9A to FIG. 14B. FIG. 9A, FIG. 10A, FIG. 11A, FIG. 12A, FIG. 13A, and FIG. 14A are each a process cross-sectional view taken along the line III-III in FIG. 1, and FIG. 9B, FIG. 10B, FIG. 11B, FIG. 12B, FIG. 13B, and FIG. 14B are each a process cross-sectional view taken along the line IV-IV in FIG. 1.

In this first embodiment, a process of forming the field-effect transistor Q, which is included in a process of producing the semiconductor device 1, will be mainly described.

Figure 9A:
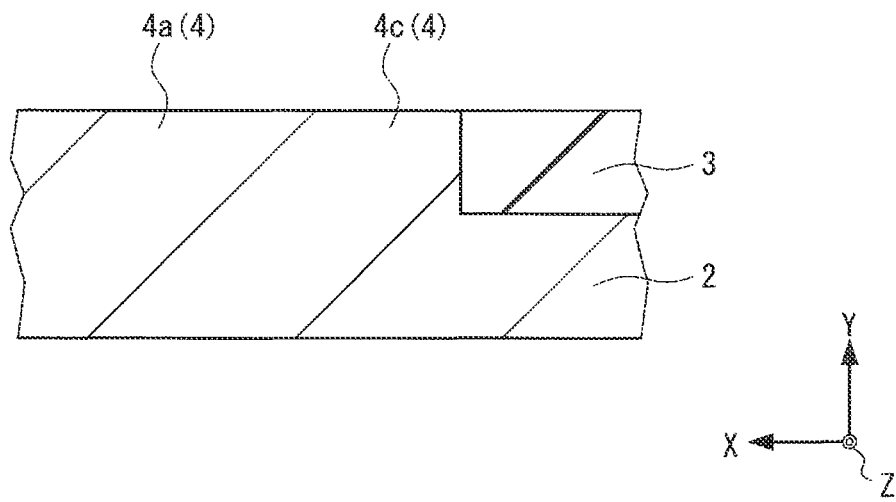
FIG. 9A is a process cross-sectional view showing a method of producing the semiconductor device according to the first embodiment of the present technology.
Figure 9B:
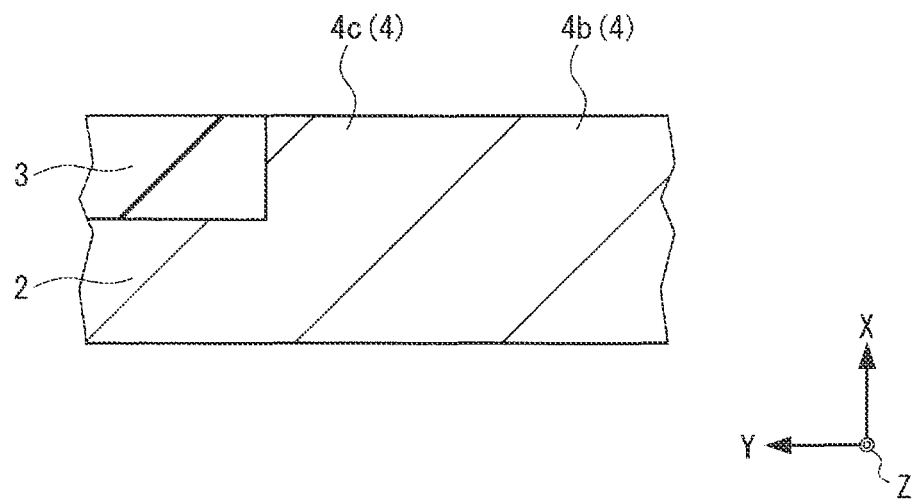
FIG. 9B is a process cross-sectional view showing the method of producing the semiconductor device according to the first embodiment of the present technology.

First, the semiconductor layer 2 is prepared and the active region 4 demarcated by the separation region 3 is formed on the main surface side of the semiconductor layer 2 as shown in FIG. 9A and FIG. 9B. The active region 4 is demarcated by, for example, forming the separation region 3 using a well-known STI technology. Specifically, the active region 4 including the first portion 4a, the second portion 4b, and the L-shaped corner 4c (see FIG. 1 and FIG. 2) is formed by forming a shallow groove on the main surface of the semiconductor layer 2, depositing, for example, a silicon oxide film as an insulation film on the entire main surface of the semiconductor layer 2 by a CVD method so as to embed the inside of this shallow groove, and then grinding and removing the insulation film on the main surface of the semiconductor layer 2 by a CMP such that the insulation film remains selectively in the shallow groove to form the separation region 3.

Figure 10A:
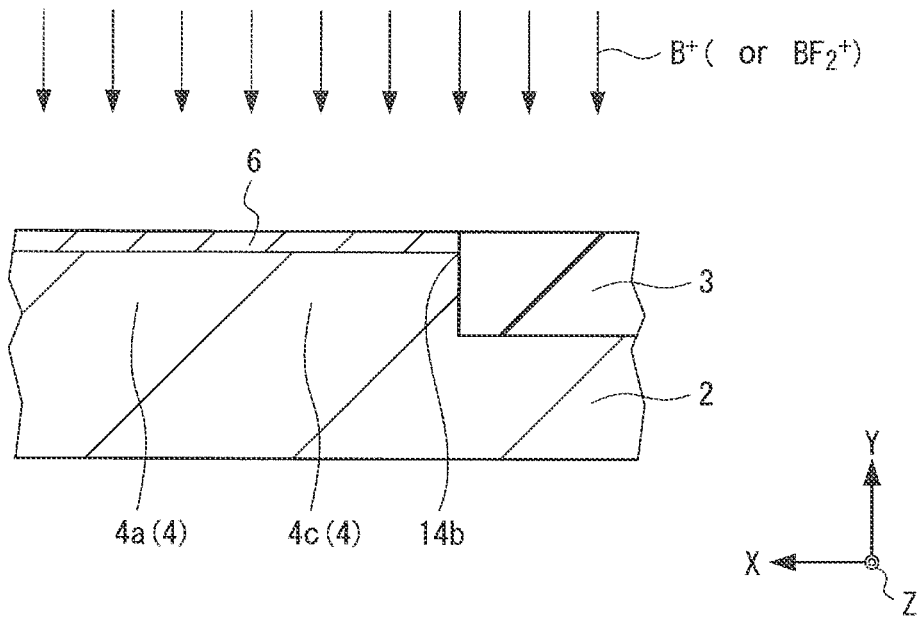
FIG. 10A is a process cross-sectional view subsequent to FIG. 9A.
Figure 10B:
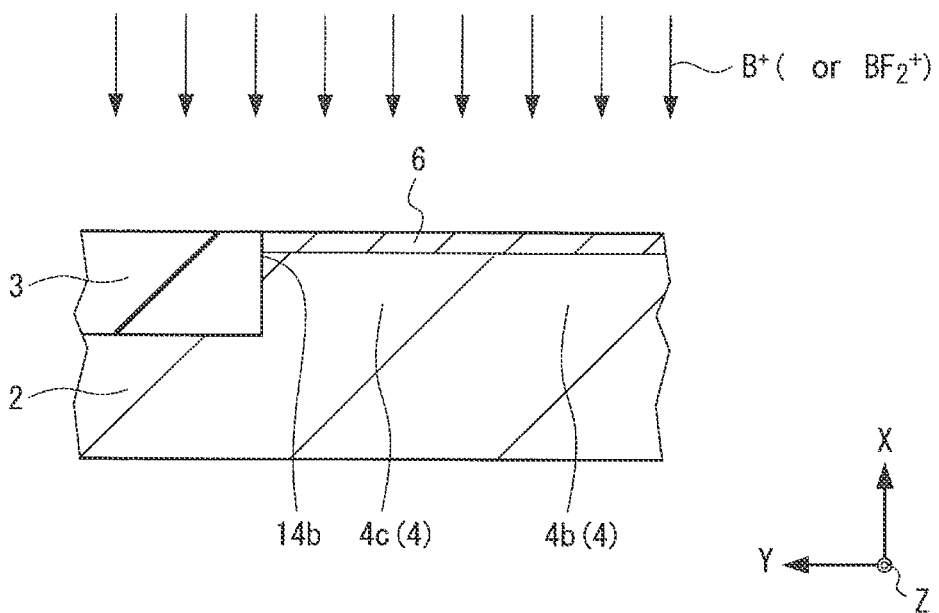
FIG. 10B is a process cross-sectional view subsequent to FIG. 9B.

Next, as shown in FIG. 10A and FIG. 10B, the channel region 6 that is a p-type semiconductor region is formed in the surface layer portion of the active region 4 of the semiconductor layer 2. The channel region 6 can be formed by, for example, implanting ions such as boron ions ($B^+$) and boron difluoride ions ($BF_2^+$) as p-type impurities into the surface layer portion of the active region 4 and then performing heat treatment for activating the impurities thereon.

In this process, although not shown in detail in FIG. 10A and FIG. 10B, the channel region inner boundary portion 14a is formed between the channel region 6 and the separation region 3 on the inner side of the corner 4c and the channel region outer boundary portion 14b is formed between the channel region 6 and the separation region 3 on the outer side of the corner 4c, referring to FIG. 5.

Figure 11A:
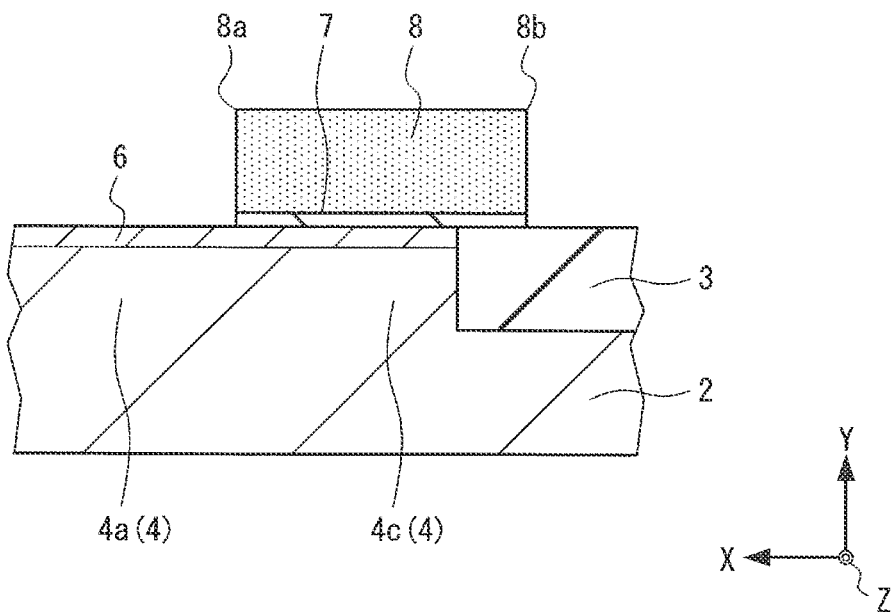
FIG. 11A is a process cross-sectional view subsequent to FIG. 10A.
Figure 11B:
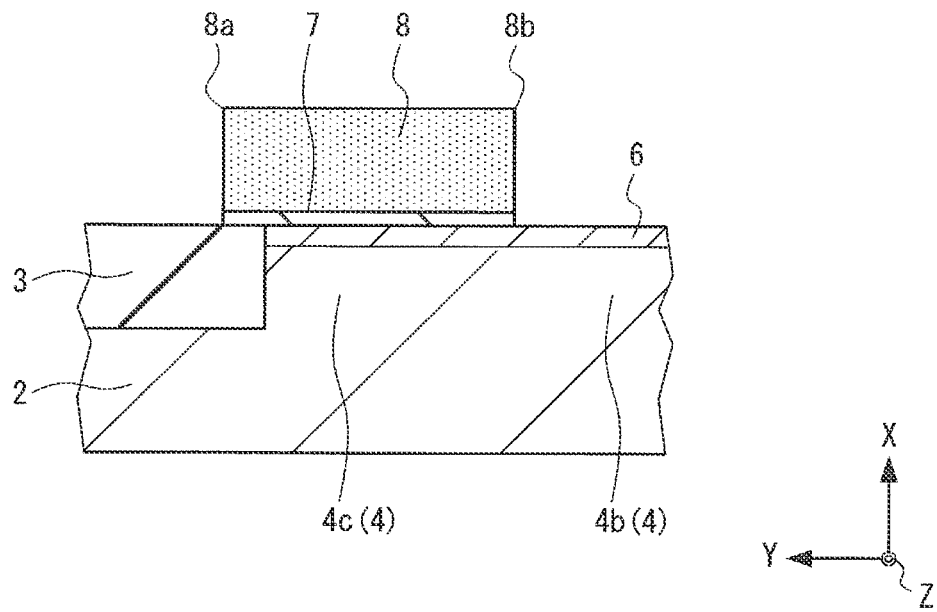
FIG. 11B is a process cross-sectional view subsequent to FIG. 10B.

Next, as shown in FIG. 11A and FIG. 11B, the gate insulating film 7 and the gate electrode 8 are formed on the active region 4 of the semiconductor layer 2 in this order. The gate insulating film 7 can be formed by depositing a silicon oxide film on the surface of the active region 4 of the semiconductor layer 2 by, for example, a thermal oxidation method or a deposition method. The gate electrode 8 can be formed by depositing, for example, a polycrystalline silicon film as a gate electrode material on the entire main surface of the semiconductor layer 2 so as to cover the gate insulating film 7 on the active region 4 and then patterning this polycrystalline silicon film into a predetermined shape. An impurity for reducing a resistance value is introduced into the polycrystalline silicon film during or after the deposition.

In this process, referring to FIG. 5, the gate electrode 8 is formed on the corner 4c of the active region 4 via the gate insulating film 7. Further, the gate electrode 8 is formed to have a square planar shape and is disposed such that the first side 8a, of the first side 8a and the second side 8b positioned on mutually opposite sides, crosses the first portion 4a of the active region 4 and the second side 8b crosses the second portion 4b of the active region 4. The first side 8a is inclined such that the inclination angle θ8ax on the interior angle side formed with the extending direction (X direction) of the first portion 4a of the active region 4 is 45 degrees, and the second side 8b is inclined such that the inclination angle θ8*bx* on the interior angle side formed with the extending direction (Y direction) of the second portion 4*b* of the active region 4 is 45 degrees.

Figure 12A:
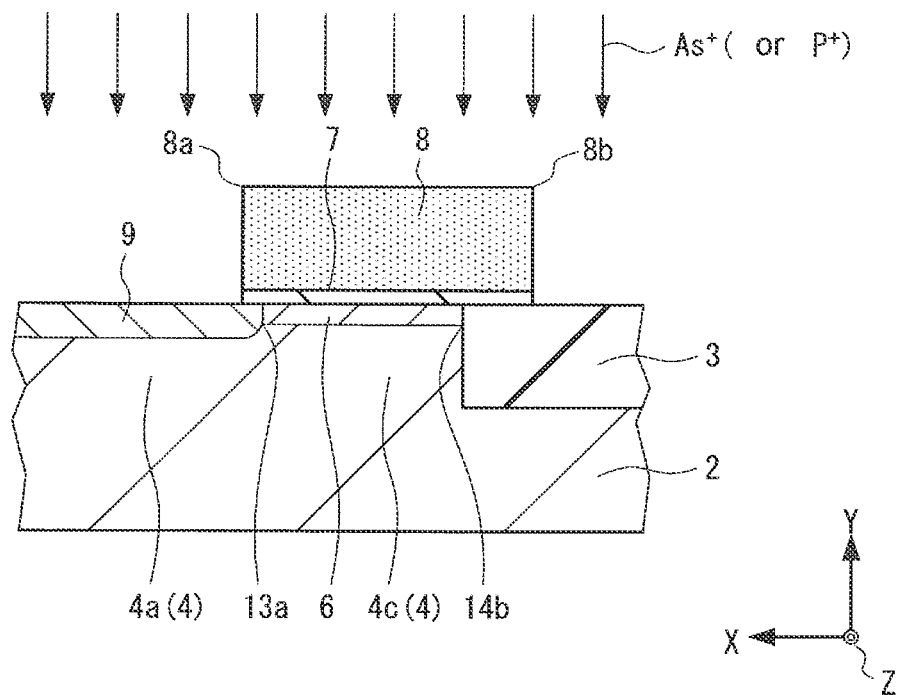
FIG. 12A is a process cross-sectional view subsequent to FIG. 11A.
Figure 12B:
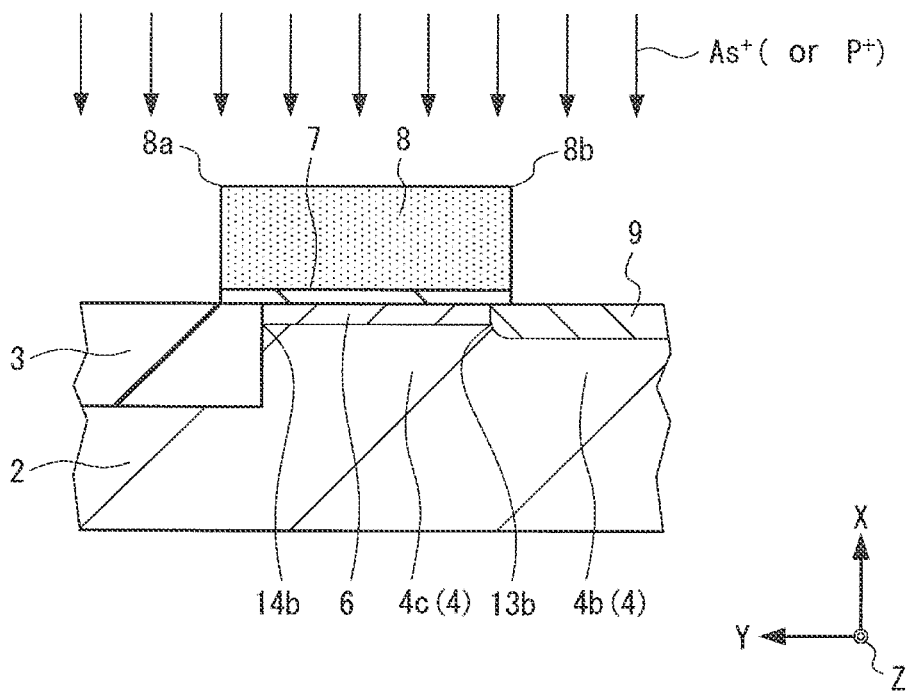
FIG. 12B is a process cross-sectional view subsequent to FIG. 11B.

Next, as shown in FIG. 12A and FIG. 12B, the extension region 9 that is an n-type semiconductor region is formed in each of the first portion 4*a* and the second portion 4*b* of the active region 4 of the semiconductor layer 2. The extension region 9 can be formed by using the separation region 3 and the gate electrode 8 as a mask for introducing impurities, implanting ions such as arsenic ions ($As^+$) and phosphorus ions ($P^+$) as n-type impurities into the active region 4 (the first portion 4*a* and the second portion 4*b*) between the separation region 3 and the gate electrode 8, and then performing heat treatment for activating the impurities thereon.

In this process, the extension region 9 on the side of the first portion 4*a* is formed by self-alignment with respect to the side of the first side 8*a* of the gate electrode 8. Then, the extension region 9 on the side of the first portion 4*a* is formed in contact with the channel region 6 and the first channel boundary portion 13*a* is formed between the extension region 9 on the side of the first portion 4*a* and the channel region 6. The first channel boundary portion 13*a* is formed linearly following the shape of the first side 8*a* of the gate electrode 8.

Further, in this process, the extension region 9 on the side of the second portion 4*b* is formed by self-alignment with respect to the side of the second side 8*b* of the gate electrode 8. Then, the extension region 9 on the side of the second portion 4*b* is formed in contact with the channel region 6 and the second channel boundary portion 13*b* is formed between the extension region 9 on the side of the second portion 4*b* and the channel region 6. The second channel boundary portion 13*b* is formed linearly following the shape of the second side 8*b* of the gate electrode 8.

Further, in this process, the length of the channel region inner boundary portion 14*a* between the inner side of the channel region 6 and the separation region 3 is defined by the inner side of each of the first channel boundary portion 13*a* and the second channel boundary portion 13*b*. The length of the channel region inner boundary portion 14*b* between the inner side of the channel region 6 and the separation region 3 is defined by the outer side of each of the first channel boundary portion 13*a* and the second channel boundary portion 13*b*.

Figure 13A:
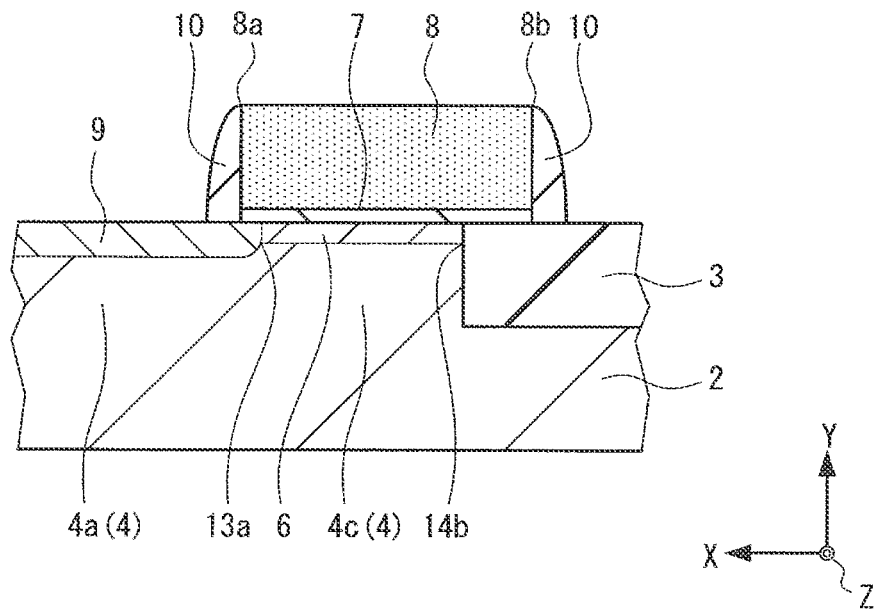
FIG. 13A is a process cross-sectional view subsequent to FIG. 12A.
Figure 13B:
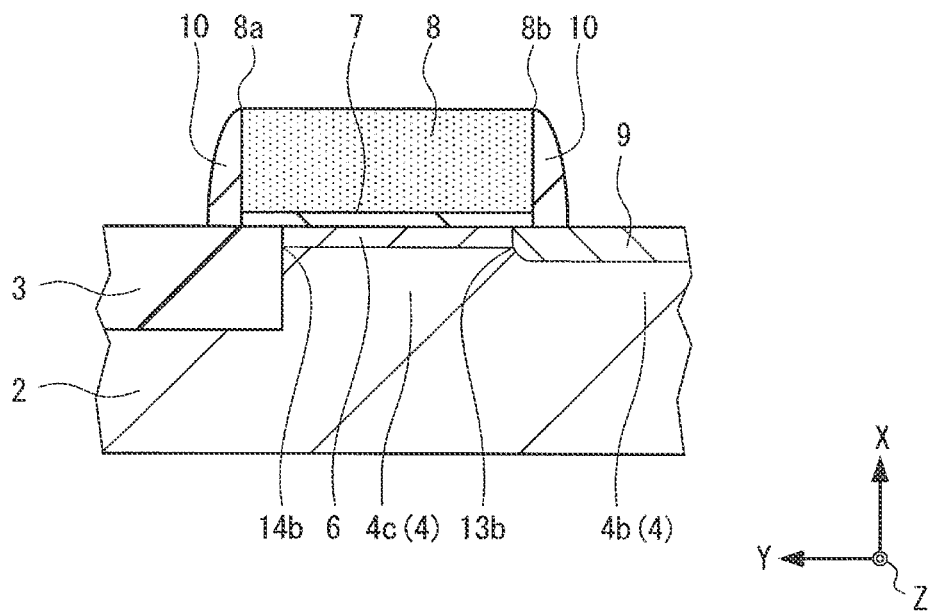
FIG. 13B is a process cross-sectional view subsequent to FIG. 12B.

Next, as shown in FIG. 13A and FIG. 13B, the sidewall spacer 10 is formed on the side wall of the gate electrode 8. The sidewall spacer 10 can be formed by, for example, depositing, for example, a silicon oxide film as an insulation film on the entire surface of the semiconductor layer 2 by a CVD method so as to cover the active region 4 and the gate electrode 8 and then applying anisotropic etching such as RIE (Reactive Ion Etching) to this silicon oxide film. The sidewall spacer 10 is formed on the side wall of the gate electrode 8 so as to surround the gate electrode 8 and is formed by self-alignment with respect to the gate electrode 8.

Figure 14A:
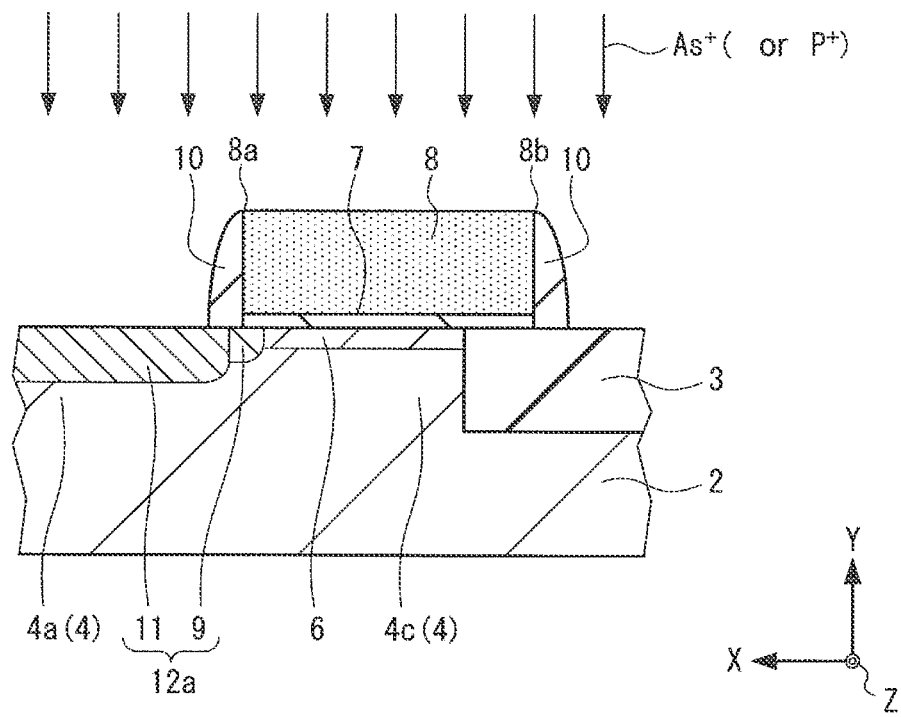
FIG. 14A is a process cross-sectional view subsequent to FIG. 13A.
Figure 14B:
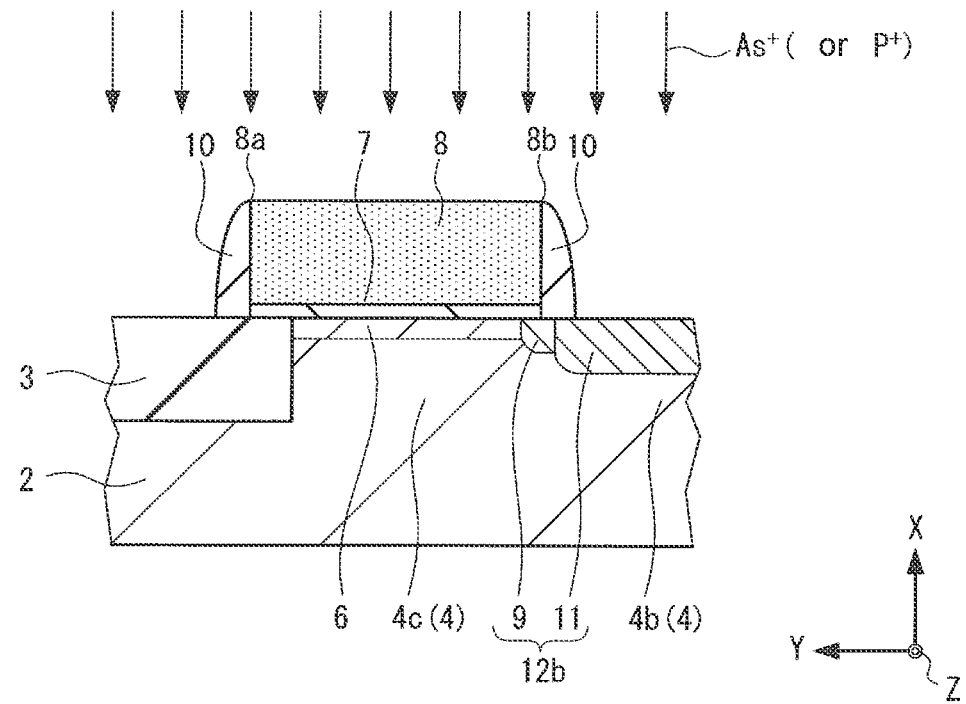
FIG. 14B is a process cross-sectional view subsequent to FIG. 13B.

Next, as shown in FIG. 14A and FIG. 14B, the contact region 11 that is an n-type semiconductor region is formed on each of the first portion 4*a* and the second portion 4*b* of the active region 4 of the semiconductor layer 2. The contact region 11 can be formed by using the separation region 3, the gate electrode 8, and the sidewall spacer 10 as a mask for introducing impurities, implanting ions such as arsenic ions ($As^+$) and phosphorus ions ($P^+$) as n-type impurities into the active region 4 (the first portion 4*a* and the second portion 4*b*) between the separation region 3 and the sidewall spacer 10 and then performing heat treatment for activating the impurities thereon. The contact region 11 on the side of the first portion 4*a* is formed by self-alignment with respect to the sidewall spacer 10 on the side of the first side 8*a* of the gate electrode 8. Further, the contact region 11 on the side of the second portion 4*b* is formed by self-alignment with respect to the sidewall spacer 10 on the side of the second side 8*b* of the gate electrode 8.

In this process, the source region (one main electrode region) 12*a* including the extension region 9 and the contact region 11 is formed in the first portion 4*a* of the active region 4, and the drain region (other main electrode region) 12*b* including the extension region 9 and the contact region 11 is formed in the second portion 4*b* of the active region 4. Then, the first channel boundary portion 13*a* is the boundary between the source region 12*a* including the extension region 9 and the contact region 11 and the channel region 6, and the second channel boundary portion 13*b* is the boundary between the drain region 12*b* including the extension region 9 and the contact region 11 and the channel region 6.

Through this process, the field-effect transistor Q shown in FIG. 1 to FIG. 4 is substantially completed.

Main Effects of First Embodiment

Figure 7:
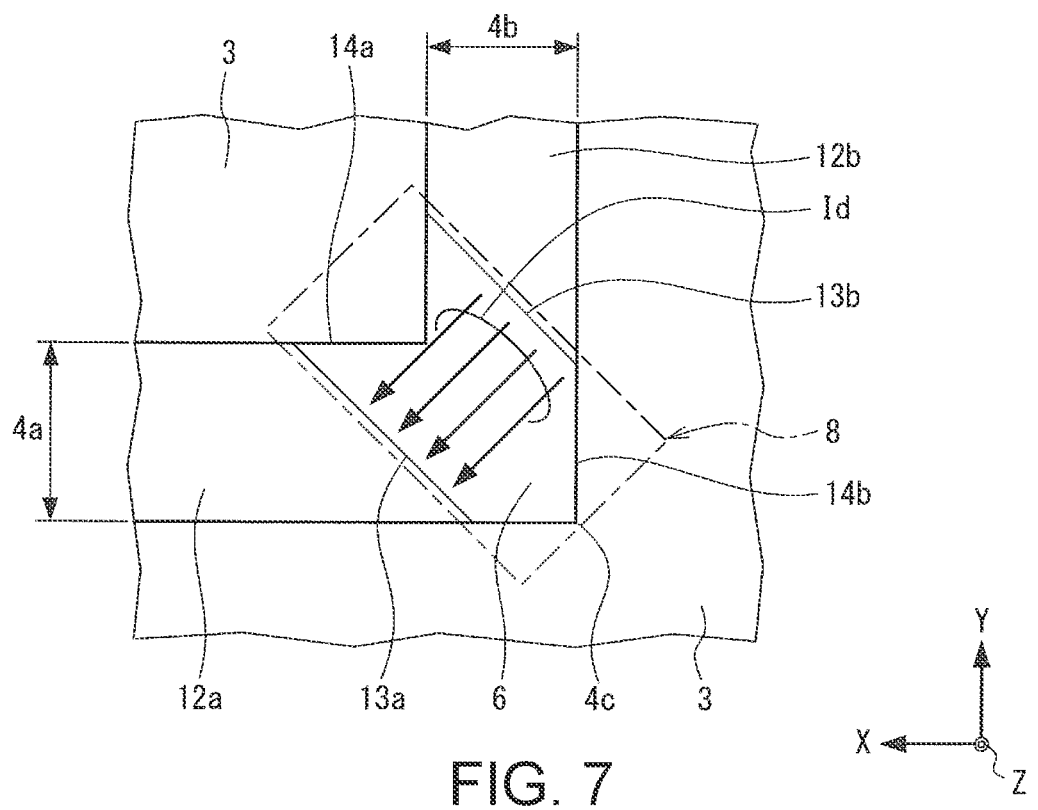
FIG. 7 is a diagram showing an effective channel width in a channel region.
Figure 8:
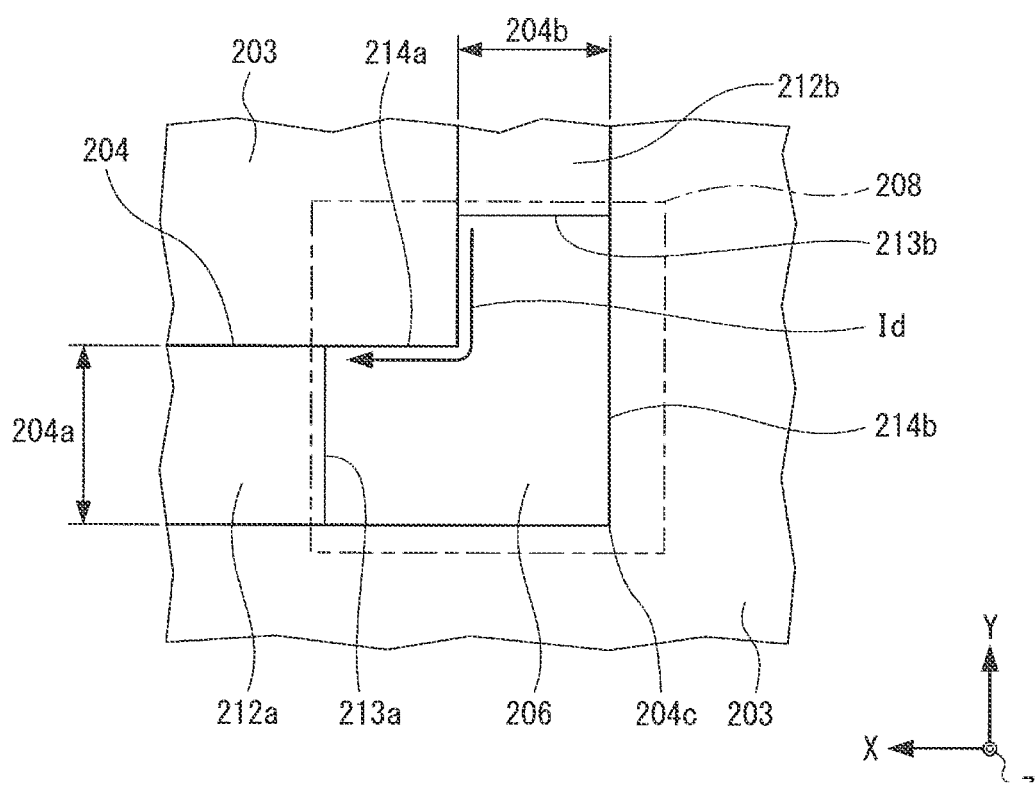
FIG. 8 is a diagram showing an effective channel width in an existing channel region.

Next, the main effects of this first embodiment will be described in comparison with the existing field-effect transistor. FIG. 7 is a diagram showing the effective channel width in the channel region of the field-effect transistor Q according to the present technology. FIG. 8 is a schematic plan view showing the effective channel width in the channel region of the existing field-effect transistor.

As shown in FIG. 8, in the existing field-effect transistor, a gate electrode 208 is disposed at a corner 204*c* of an active region 204 demarcated by a separation region 203. Then, a first channel boundary portion 213*a* on the side of a source region 212*a* and a second channel boundary portion 213*b* on the side of a drain region 212*b* are disposed such that virtual lines extending along the respective portions are orthogonal to each other. For this reason, in the existing field-effect transistor, the first channel boundary portion 213*a* on the side of the source region 212*a* and the second channel boundary portion 213*b* on the side of the drain region 212*b* are not positioned on mutually opposite sides sandwiching a channel region 206. In other words, the first channel boundary portion 213*a* and the second channel boundary portion 213*b* do not face each other sandwiching the channel region 206.

In such an existing field-effect transistor, the difference between the length of a channel region outer boundary portion 214*b* and the length of a channel region inner boundary portion 214*a* becomes extremely large. Then, a current (drain current) Id tends to flow through, as a path, the inner side of the channel region 206 in which the distance between the source region 212*a* and the drain region 212*b* is the shortest (the vicinity of the channel region inner boundary portion 214*a*), as shown in FIG. 8. For this reason, the current Id concentrates inside the channel region 206 and an effective channel width (W) decreases. When the effective channel width (W) decreases, the properties of the field-effect transistor deteriorate due to a short channel effect.

Meanwhile, in the field-effect transistor Q according to the present technology, the first channel boundary portion 13*a* on the side of the source region 12*a* and the second channel boundary portion 13*b* on the side of the drain region 12*b* are positioned on mutually opposite sides sandwiching the channel region 6, as shown in FIG. 7. In other words, the first channel boundary portion 13a and the second channel boundary portion 13b face each other sandwiching the channel region 6. Then, in this first embodiment, the first channel boundary portion 13a and the second channel boundary portion 13b are parallel to each other.

In the case of the configuration in which the first channel boundary portion 13a and the second channel boundary portion 13b face each other, although not shown in detail, as the interior angle formed by the virtual line along the first channel boundary portion 13a and the virtual line along the second channel boundary portion 13b becomes smaller, the difference between the length of the channel region outer boundary portion 14b and the length of the channel region inner boundary portion 14a becomes smaller and the width of the region through which the current Id tries to flow increases. Then, as shown in FIG. 7, when the first channel boundary portion 13a and the second channel boundary portion 13b are parallel to each other, the difference between the length of the channel region outer boundary portion 14b and the length of the channel region inner boundary portion 14a disappears, and the width of the region through which the current tries to flow becomes the widest. That is, the concentration of the current Id in the vicinity of a channel region inner boundary portion 114a in the existing structure can be alleviated and the effective channel width (W) of the field-effect transistor Q can be increased as compared with the existing case. Then, in accordance with the semiconductor device 1 according to this first embodiment, since the effective channel width (W) can be increased, it is possible to suppress deterioration of properties of the field-effect transistor Q due to a short channel effect.

Further, in this first embodiment, the first channel boundary portion 13a and the second channel boundary portion 13b face each other in parallel sandwiching the channel region 6. Therefore, as compared with the case where the first channel boundary portion 13a and the second channel boundary portion 13b face each other sandwiching the channel region 6 but are not parallel to each other, it is possible to further increase the effective channel width (W) of the field-effect transistor Q and further suppress deterioration of properties of the field-effect transistor Q due to a short channel effect.

MODIFIED EXAMPLE

First and Second Modified Examples

In the above-mentioned first embodiment, the case where the first channel boundary portion 13a and the second channel boundary portion 13b are parallel to each other has been described as the configuration in which the first channel boundary portion 13a and the second channel boundary portion 13b face each other sandwiching the channel region 6. However, the present technology is not limited to the configuration of the above-mentioned first embodiment.

Figure 15A:
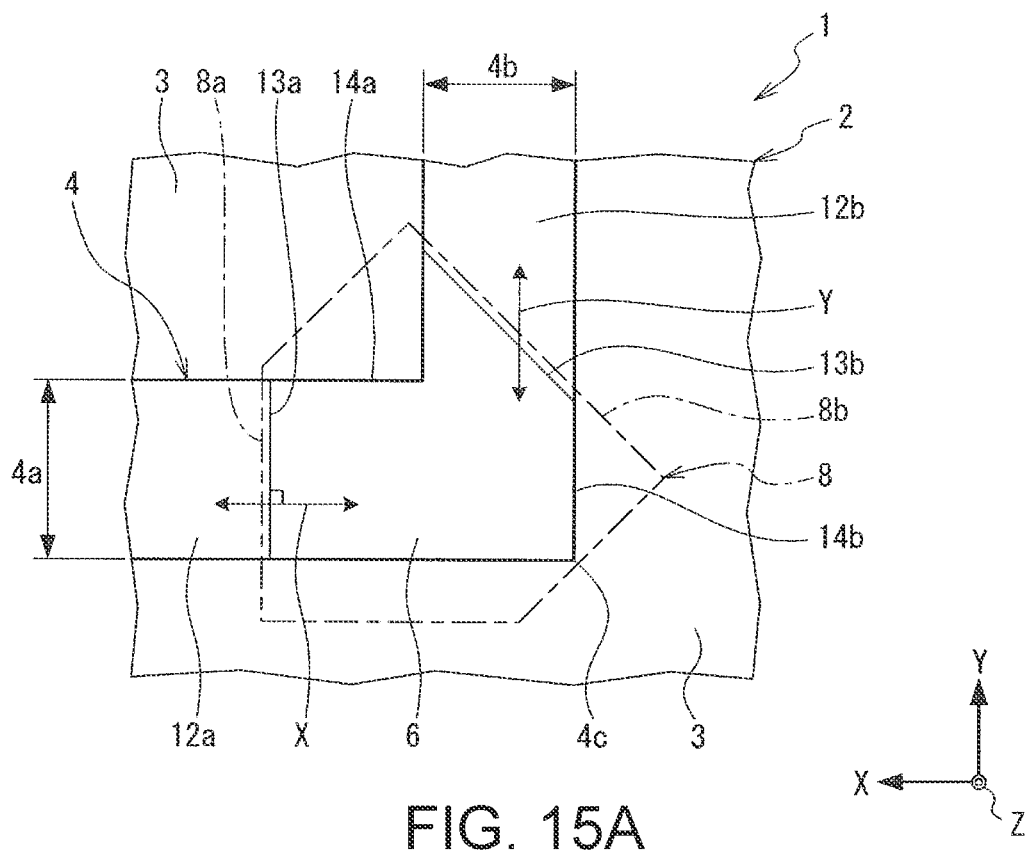
FIG. 15A is a schematic plan view of a main portion showing a first modified example of the semiconductor device according to the first embodiment of the present technology.

For example, as the configuration in which the first channel boundary portion 13a and the second channel boundary portion 13b face each other sandwiching the channel region 6, the first channel boundary portion 13a may be orthogonal to the extending direction (X direction) of the first portion 4a of the active region 4 and the second channel boundary portion 13b may be inclined with respect to the extending direction (Y direction) of the second portion 4b of the active region 4, as shown in FIG. 15A according to a first modified example.

Figure 15B:
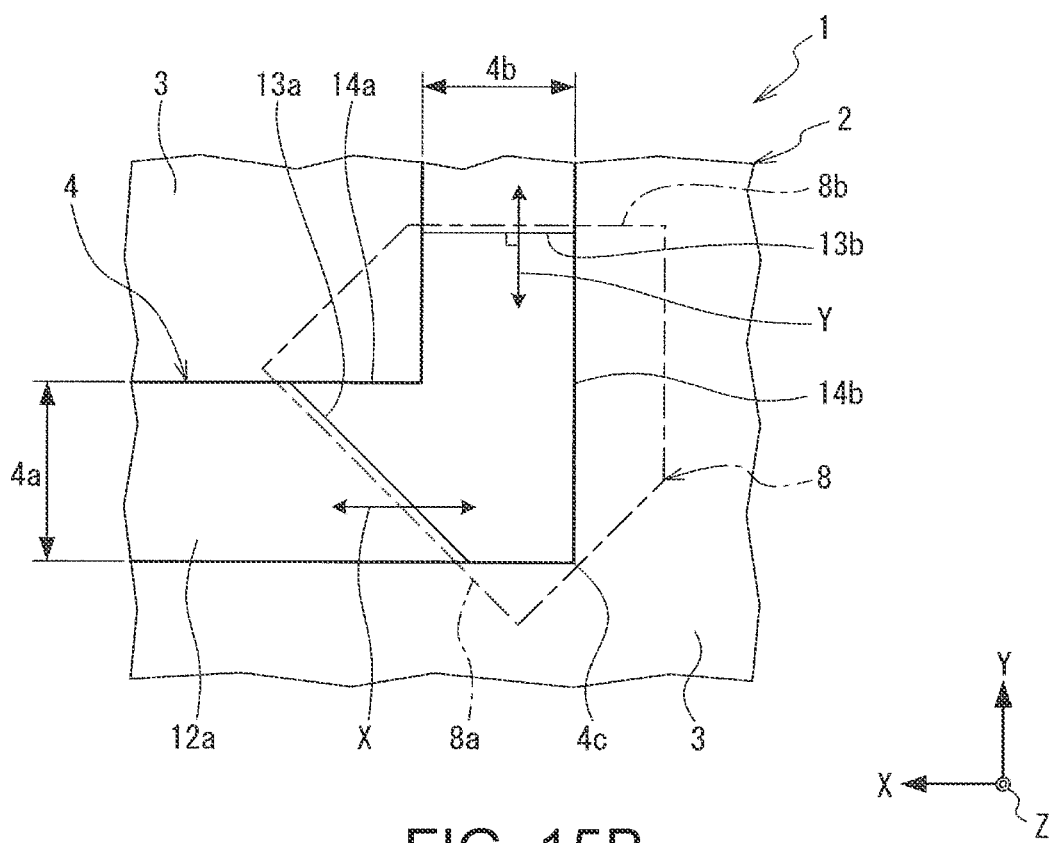
FIG. 15B is a schematic plan view of a main portion showing a second modified example of the semiconductor device according to the first embodiment of the present technology.

Further, as the configuration in which the first channel boundary portion 13a and the second channel boundary portion 13b face each other sandwiching the channel region 6, the first channel boundary portion 13a may be inclined with respect to the extending direction (X direction) of the first portion 4a of the active region 4 and the second channel boundary portion 13b may be orthogonal to the extending direction (Y direction) of the second portion 4b of the active region 4, as shown in FIG. 15B according to a second modified example.

In short, one of the first channel boundary portion 13a and the second channel boundary portion 13b may be orthogonal to the extending direction (X direction) of the active region 4 and the other may be inclined with respect to the extending direction (Y direction) of the active region 4.

Also in the first modified example and the second modified example, the effective channel width (W) of the field-effect transistor Q can be increased similarly to the above-mentioned first embodiment. Further, it is possible to suppress deterioration of properties of the field-effect transistor Q due to a short channel effect.

Third and Fourth Modified Example

Figure 16A:
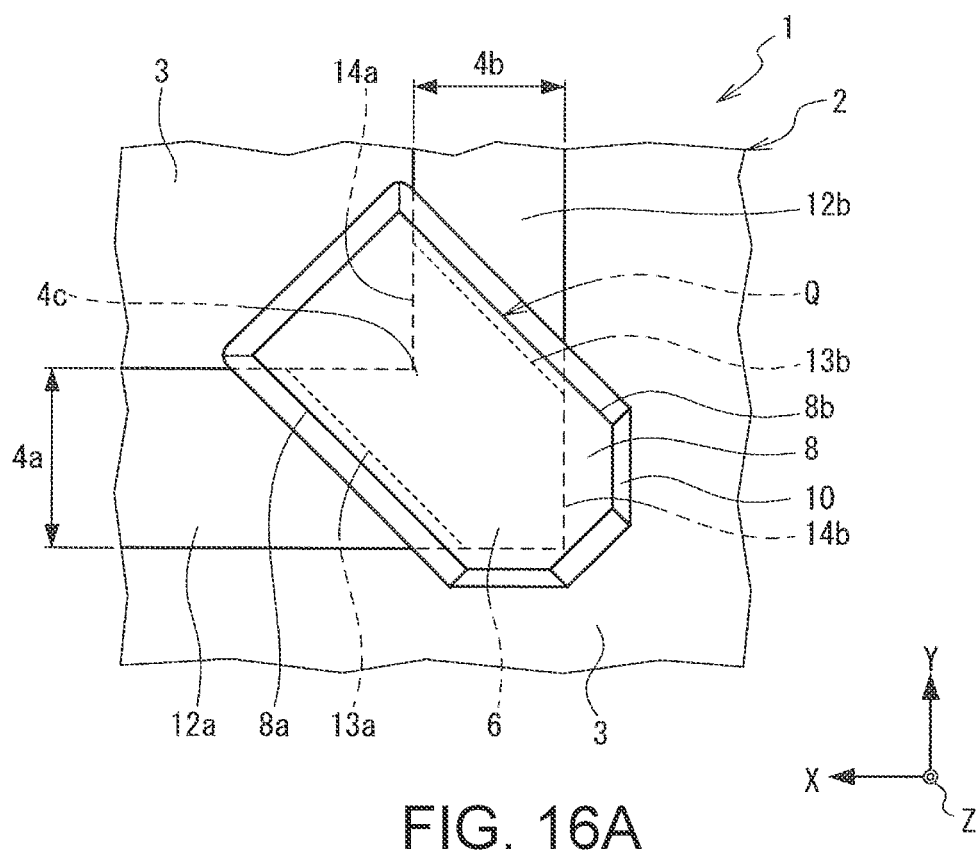
FIG. 16A is a schematic plan view of a main portion showing a third modified example of the semiconductor device according to the first embodiment of the present technology.

Further, although the case where the gate electrode 8 is formed in a square planar pattern has been described in the above-mentioned first embodiment, the shape is not limited to that in the first embodiment. For example, the gate electrode 8 may have a shape in which chamfered portions are provided at the two corners located on the outer side of the corner 4c, as shown in FIG. 16A according to a third modified example.

Figure 16B:
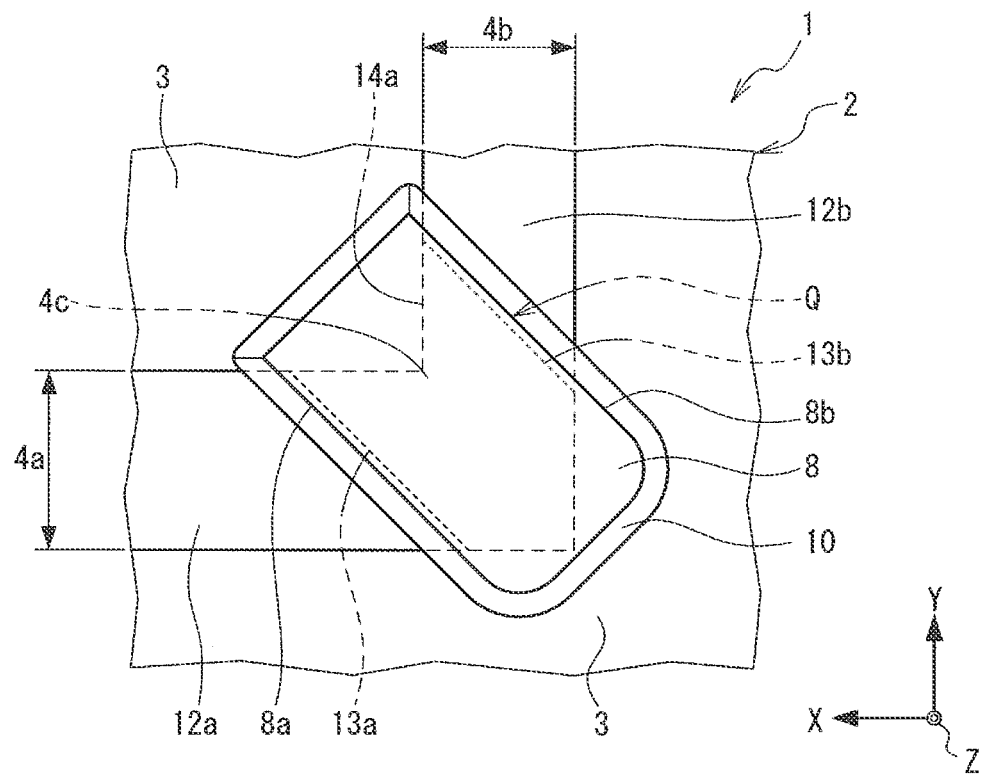
FIG. 16B is a schematic plan view of a main portion showing a fourth modified example of the semiconductor device according to the first embodiment of the present technology.

Further, in the gate electrode 8, each of the two corners located on the outer side of the corner 4c may have a round shape as shown in FIG. 16B according to a fourth modified example or may have an arc shape.

Fifth Modified Example

Figure 16C:
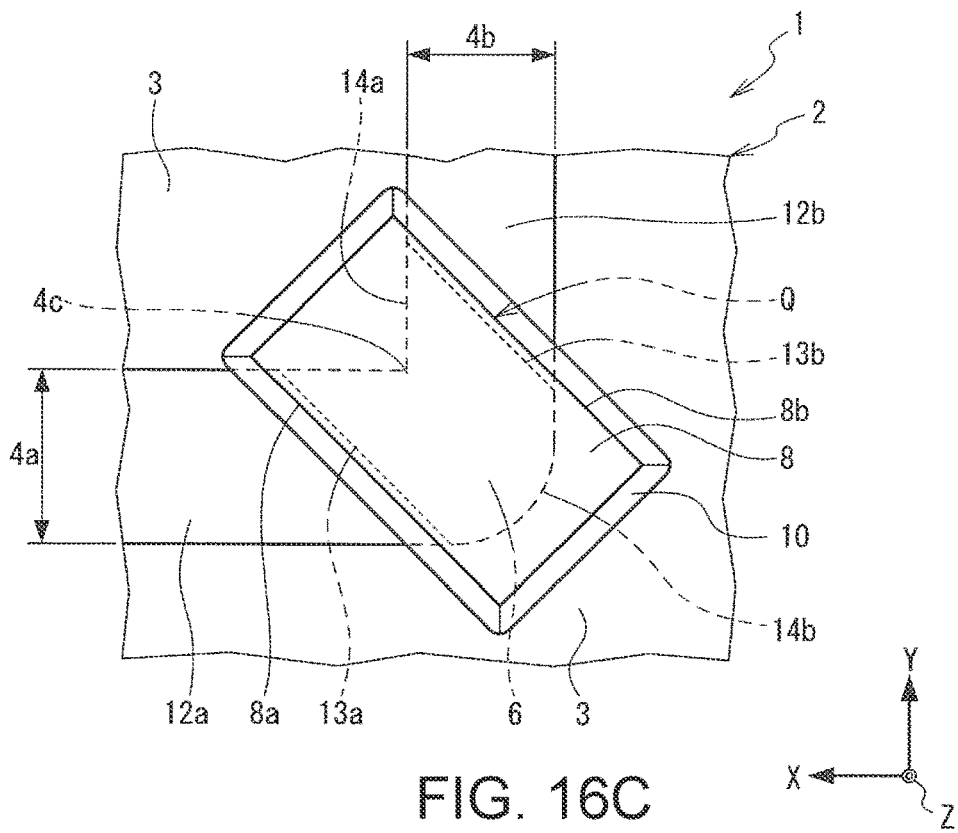
FIG. 16C is a schematic plan view of a main portion showing a fifth modified example of the semiconductor device according to the first embodiment of the present technology.

Further, although the case where the planar shape of the channel region outer boundary portion 14b is a right-angled shape has been described in the above-mentioned first embodiment, the planar shape of the channel region outer boundary portion 14b may be a round shape or an arc shape as shown in, for example, FIG. 16C according to a fifth modified example.

Other Modified Examples

In the above-mentioned first embodiment, the configuration in which the channel region 6 and the pair of main electrode regions 12a and 12b of the field-effect transistor Q are provided in the semiconductor layer 2 has been described. However, the present technology is not limited to this configuration of the first embodiment. For example, a well region may be provided in the semiconductor layer 2, and the channel region 6 and the pair of main electrode regions 12a and 12b of the field-effect transistor Q may be provided inside this well region. Further, the channel region 6 may include a well region between the pair of main electrode regions 12a and 12b.

Second Embodiment

A semiconductor device 1A according to a second embodiment of the present technology has basically the same configuration as that of the semiconductor device 1 according to the above-mentioned first embodiment, and the configuration of the separation region differs.

Figure 17:
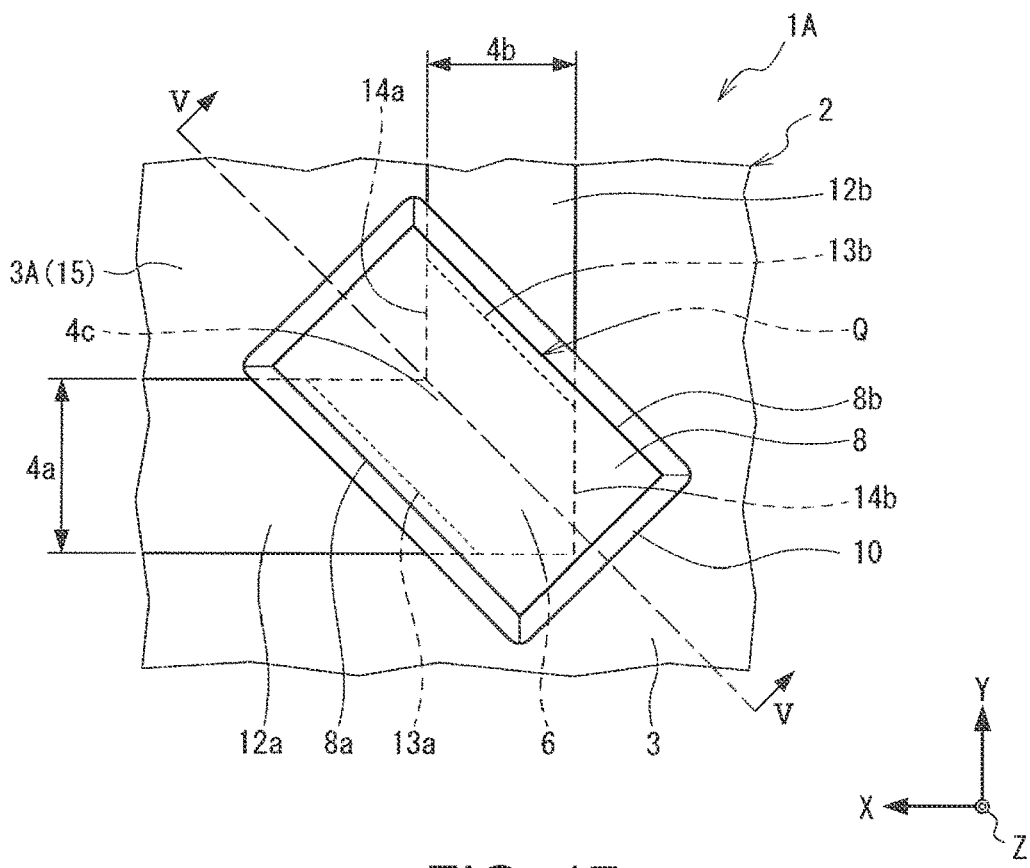
FIG. 17 is a schematic plan view of a main portion showing a configuration example of a semiconductor device according to a second embodiment of the present technology.
Figure 18:
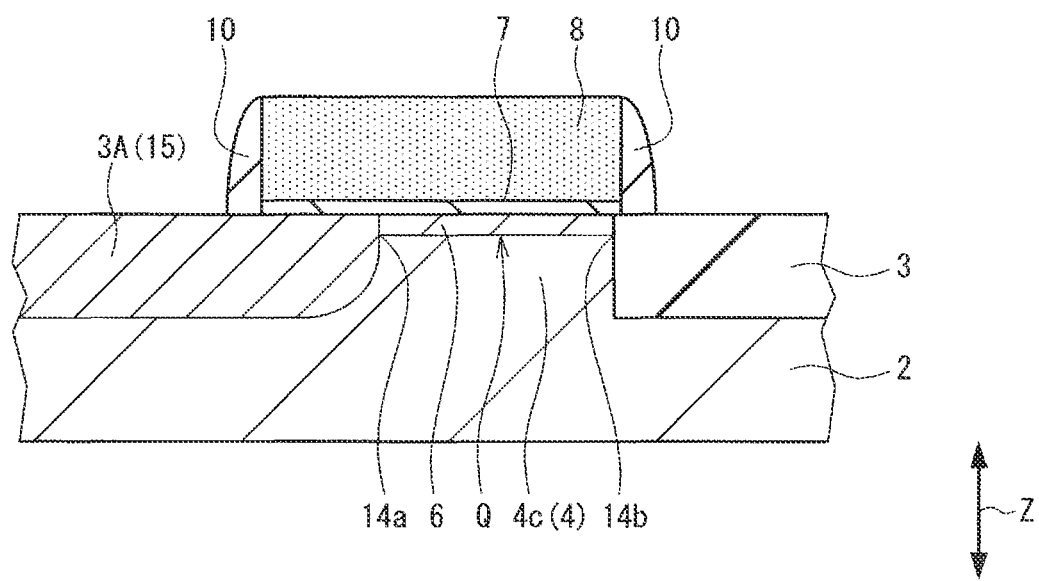
FIG. 18 is a schematic cross-sectional view showing a cross-sectional structure taken along the line V-V in FIG. 17.

That is, as shown in FIG. 17 and FIG. 18, in this second embodiment, the separation region 3 demarcating the active region 4, a separation region 3A that is in contact with the inner side of the channel region 6 includes a p-type semiconductor region 15 provided in the semiconductor layer 2. Other configurations are similar to those in the above-mentioned first embodiment.

The separation region 3 on the outer side of the channel region 6 (on the side of the channel region outer boundary portion 14*b*) has a groove structure in which an insulation film is embedded inside the groove portion. Meanwhile, the separation region 3A on the outer side of the channel region 6 (on the side of the channel region inner boundary portion 14*a*) has a junction-type separation structure in which the semiconductor region 15 is provided in the semiconductor layer 2. In a groove-type separation structure, since a groove portion is formed in the semiconductor layer 2, a leak path due to mechanical processing damage is likely to occur in the channel region outer boundary portion 14*b*. Meanwhile, in the junction-type separation structure, since it is formed by implanting impurities as ions into the semiconductor layer 2 and then performing heat treatment for activating the impurities thereon, the mechanical damage is less as compared with the groove-type separation structure and a leak path is less likely to occur in the channel region inner boundary portion 14*a*. In the field-effect transistor Q in which the gate electrode 8 is provided at the corner 4*c* of the active region 4, the current Id flows more biased toward the side of the channel region inner boundary portion 14*a* than the side of the channel region outer boundary portion 14*b*.

Therefore, in accordance with the semiconductor device 1A according to this second embodiment, it is possible to increase the effective channel width (W) of the field-effect transistor Q and further suppress fluctuations in properties of the field-effect transistor Q due to a leak path.

Third Embodiment

A semiconductor device 1B according to a third embodiment of the present technology has basically the same configuration as that of the semiconductor device 1 according to the above-mentioned first embodiment, and the configuration of the active region differs.

Figure 19:
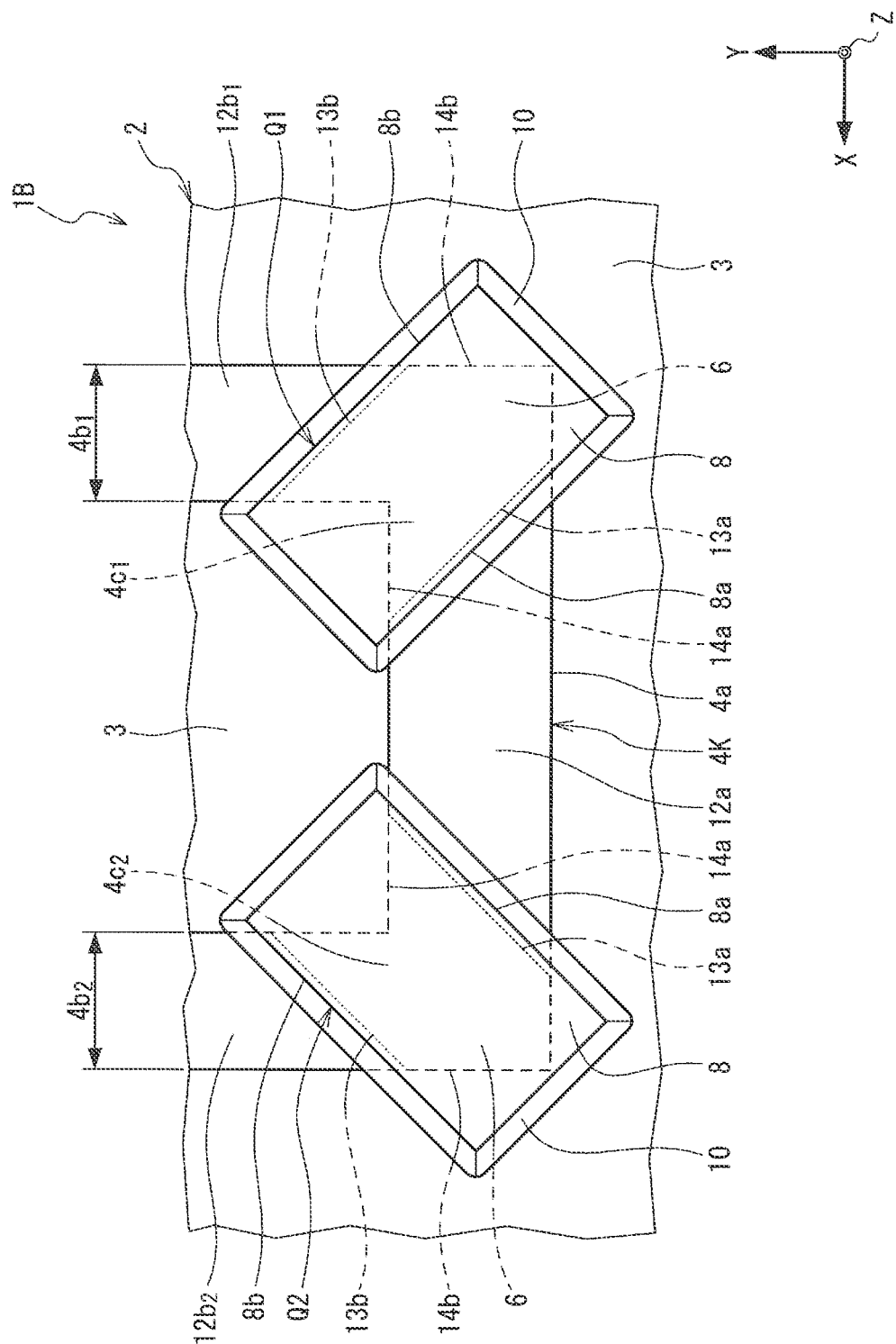
FIG. 19 is a schematic plan view of a main portion showing a configuration example of a semiconductor device according to a third embodiment of the present technology.

That is, as shown in FIG. 19, the semiconductor device 1B according to this third embodiment includes an active region 4K instead of the active region 4 shown in FIG. 1. Then, the semiconductor device 1B according to this third embodiment includes two field-effect transistors Q1 and Q2 formed in the active region 4K. Other configurations are similar to those in the above-mentioned first embodiment.

As shown in FIG. 19, the active region 4K is demarcated by the separation region 3 in the semiconductor layer 2. The active region 4K includes the first portion 4*a* extending in one direction in plan view and two second portions 4*b*1 and 4*b*2 extending from this first portion 4*a* in the other direction crossing the oner direction. Of the two second portions 4*b*1 and 4*b*2, one second portion 4*b*1 extends from one end side of the first portion 4*a*1 in the other direction crossing the one direction and the other second portion 4*b*2 extends from the other end side of the first portion 4*a* in the other direction crossing the one direction. In this third embodiment, the first portion 4*a* extends in the X direction and the two second portions 4*b*1 and 4*b*2 extend in the Y direction. Then, the first portion 4*a* and the two second portions 4*b*1 and 4*b*2 are orthogonal to each other and the two second portions 4*b*1 and 4*b*2 face each other sandwiching the separation region 3. That is, in the active region 4K according to this third embodiment, the two second portions 4*b*1 and 4*b*2 are connected to the first portion 4*a* so as to relatively bend via corners 4*c*1 and 4*c*2, respectively. Then, each of the corners 4*c*1 and 4*c*2 has an L-shaped planar pattern. Then, the active region 4K has a U-shaped planar pattern.

Each of the two field-effect transistors Q1 and Q2 has a configuration similar to that of the field-effect transistor Q according to the above-mentioned first embodiment. Then, the gate electrode 8 of one field-effect transistor Q1 is disposed at one corner 4*c*1 of the active region 4K, and the gate electrode 8 of the other field-effect transistor Q2 is disposed in the other corner 4*c*2 of the active region 4K.

In the gate electrode 8 of the field-effect transistor Q1, the first side 8*a* and the second side 8*b* positioned on mutually opposite sides extend parallel to each other and are inclined at an angle of 45 degrees with respect to the respective extending directions (the X direction and the Y direction) of the first portion 4*a* and the one second portion 4*b*1 of the active region 4K.

In the gate electrode 8 of the field-effect transistor Q2, the first side 8*a* and the second side 8*b* positioned on mutually opposite sides extend parallel to each other and are inclined at an angle of 45 degrees with respect to the respective extending directions (the X direction and the Y direction) of the first portion 4*a* and the other second portion 4*b*2 of the active region 4K.

The two field-effect transistors Q1 and Q2 share one main electrode region 12*a*, and the other main electrode regions 12*b*1, 12*b*1 are individually provided therein. The two field-effect transistors Q1 and Q2 can be used in series connection or parallel connection depending on the wiring connection form.

In each of the field-effect transistors Q1 and Q2, the first channel boundary portion 13*a* is inclined at, for example, an angle of 45 degrees with respect to the extending direction (X direction) of the first portion 4*a* of the active region 4 and the second channel boundary portion 13*b* is inclined at, for example, an angle of 45 degrees with respect to the extending direction (Y direction) of the second portion 4*b*1 and 4*b*2 of the active region 4, similarly to the field-effect transistor Q according to the above-mentioned first embodiment although not limited thereto. Then, referring to FIG. 6, the length A1 of the channel region inner boundary portion 14*a* and the length B1 of the channel region outer boundary portion 14*b* are equivalent to each other (A1=B1).

Also in the semiconductor device 1B according to this third embodiment, effects similar to those in the semiconductor device 1 according to the above-mentioned first embodiment can be achieved.

Fourth Embodiment

In this fourth embodiment, an example in which the present technology is applied to a solid-state imaging device that is a back-illuminated CMOS (Complementary MOS) image sensor as a semiconductor device will be described with reference to FIG. 20 to FIG. 27. Note that FIG. 24 is a schematic plan view of a main portion as seen from the side of a first surface S1 of a semiconductor layer 40 shown in FIG. 23.

<<Entire Configuration of Solid-State Imaging Device>>

First, the entire configuration of a solid-state imaging device 1C will be described.

Figure 20:
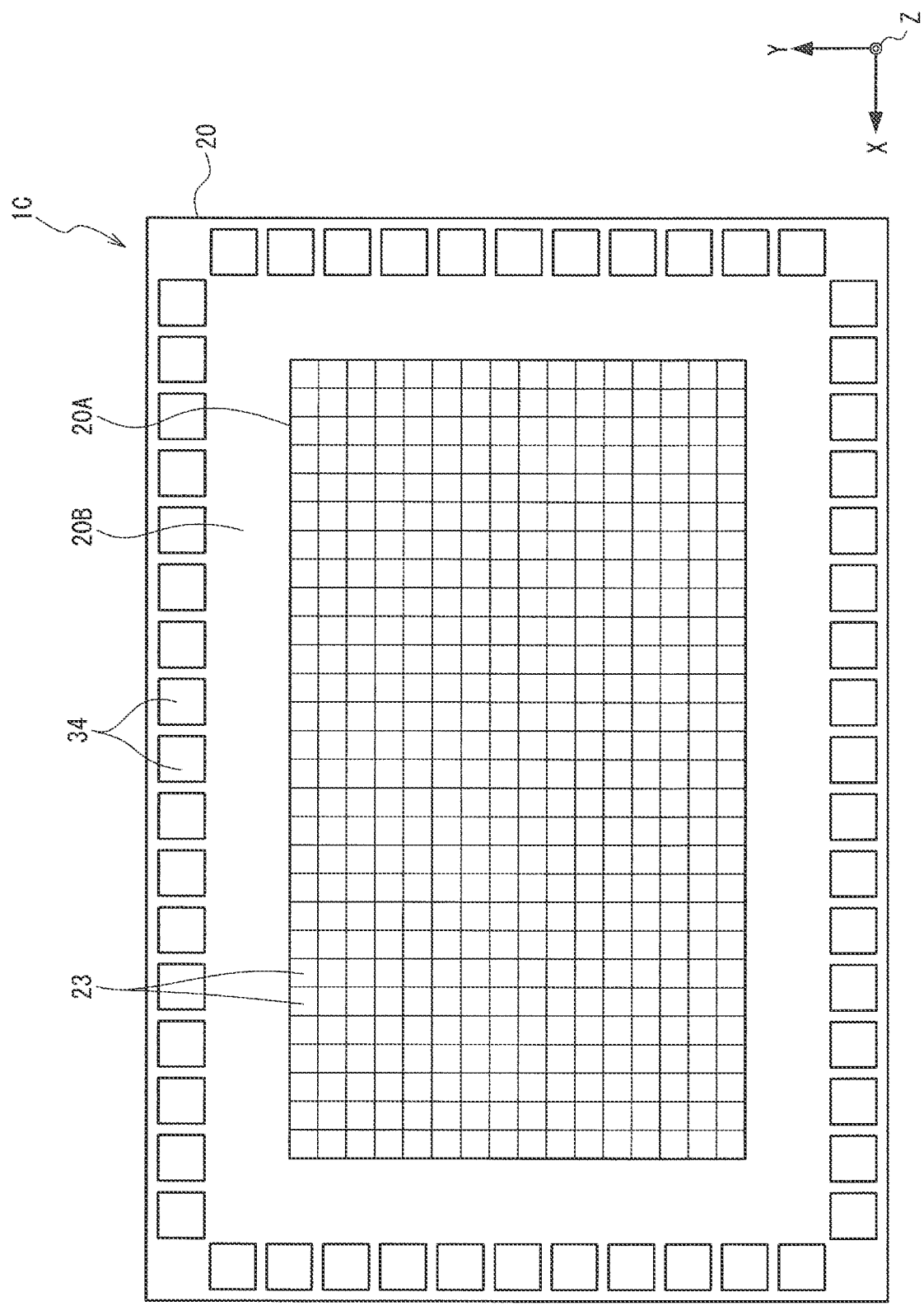
FIG. 20 is a schematic plan layout diagram showing a configuration example of a solid-state imaging device according to a fourth embodiment of the present technology.
Figure 29:
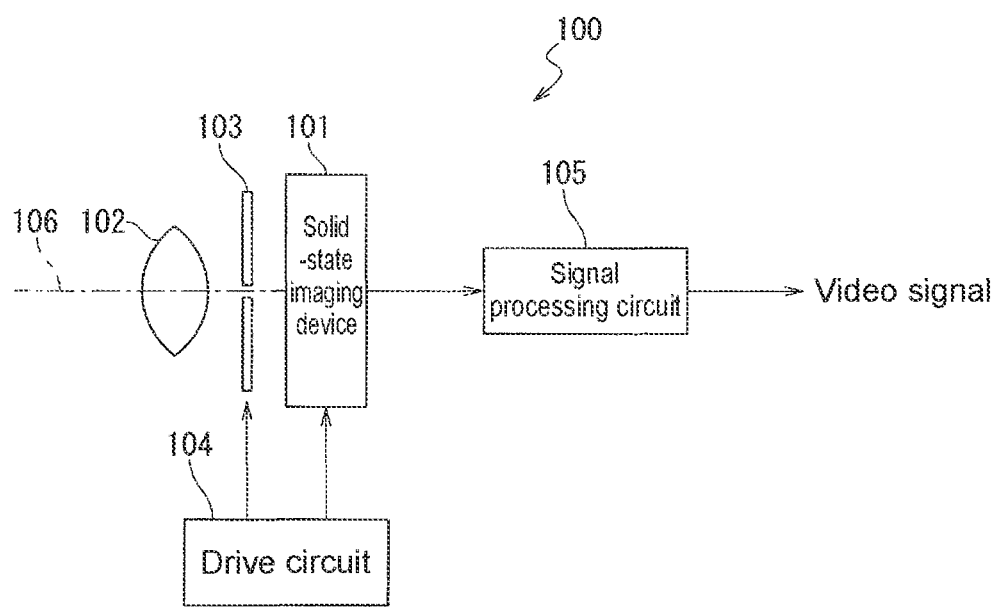
FIG. 29 is a diagram showing a schematic configuration of an electronic apparatus according to a fifth embodiment of the present technology.

As shown in FIG. 20, the solid-state imaging device 1C according to a fourth embodiment of the present technology mainly includes a semiconductor chip 20 having a square two-dimensional planar shape in plan view. That is, the solid-state imaging device 1C is mounted on the semiconductor chip 20. As shown in FIG. 29, this solid-state imaging device 1C takes in image light from a subject (incident light 106) via an optical lens 102, converts the amount of incident light 106 formed on the imaging surface into an electrical signal for each pixel, and outputs the obtained signal as a pixel signal.

As shown in FIG. 20, the semiconductor chip 20 on which the solid-state imaging device 1C is mounted has a square pixel region 20A provided in the center and a peripheral region 20B disposed outside this pixel region 20A so as to surround the pixel region 20A, in a two-dimensional plane.

The pixel region 2A is, for example, a light-receiving surface that receives light collected by the optical lens (optical system) 102 shown in FIG. 29. Then, in the pixel region 20A, a plurality of pixels 23 is arranged in a matrix in a two-dimensional plane including the X direction and the Y direction. The pixels 23 are repeatedly arranged in each of the X direction and the Y direction orthogonal to each other in a two-dimensional plane.

As shown in FIG. 20, a plurality of bonding pads 34 is arranged in the peripheral region 20B. The plurality of bonding pads 34 are arranged on the respective four sides of the semiconductor chip 20 in a two-dimensional plane, for example. Each of the plurality of bonding pads 34 is an input/output terminal used when electrically connecting the semiconductor chip 20 to an external device.

Figure 21:
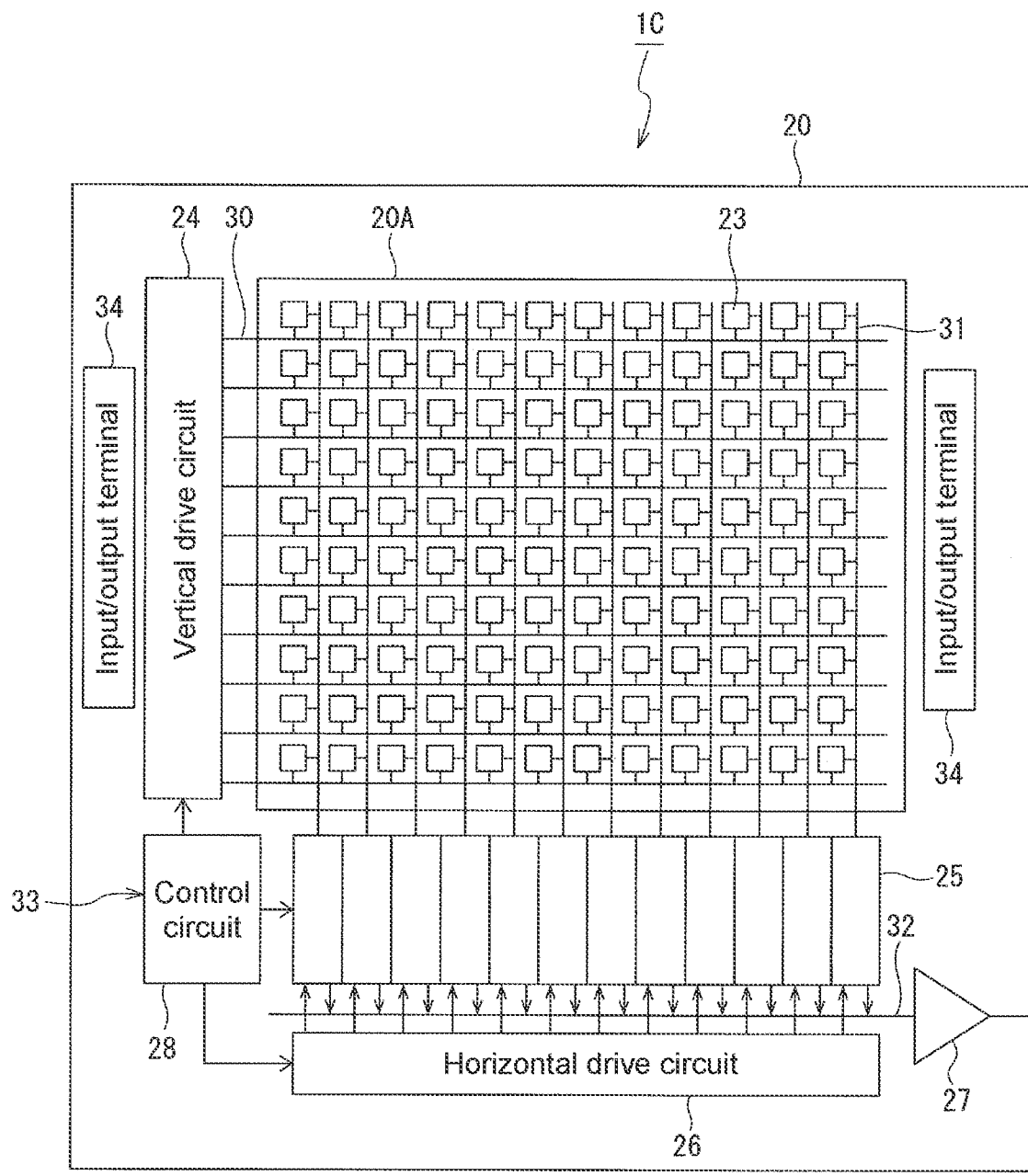
FIG. 21 is a block diagram showing a configuration example of the solid-state imaging device according to the fourth embodiment of the present technology.

As shown in FIG. 21, the semiconductor chip 20 includes a logic circuit 33 including a vertical drive circuit 24, a column signal processing circuit 25, a horizontal drive circuit 26, an output circuit 27, a control circuit 28, and the like. The logic circuit 33 includes, for example, a CMOS circuit including an n-channel conductive type MOSFET and a p-channel conductive type MOSFET.

The vertical drive circuit 24 includes, for example, a shift register. The vertical drive circuit 24 sequentially selects a desired pixel drive line 30 and supplies pulses for driving the pixels 23 to the selected pixel drive line 30 to drive the respective pixels 23 in row units. That is, the vertical drive circuit 24 sequentially selectively scans the respective pixels 23 of the pixel region 20A in row units in the vertical direction and supplies the pixel signal from each of the pixel 23 based on the signal charges generated by the photoelectric conversion device of the pixel 23 in accordance with the amount of received light to the column signal processing circuit 25 via a vertical signal line 31.

The column signal processing circuit 25 is arranged for, for example each column of the pixels 23 and performs signal processing such as noise removal on the signals output from the pixels 23 in one row for each pixel column. For example, the column signal processing circuit 25 performs signal processing such as CDS (Correlated Double Sampling) for removing pixel-specific fixed pattern noise and AD (Analog Digital) conversion.

The horizontal drive circuit 26 includes, for example, a shift register. The horizontal drive circuit 26 sequentially outputs a horizontal scanning pulse to the column signal processing circuit 25 to select each of the column signal processing circuits 25 in order and causes each of the column signal processing circuits 25 to output, to a horizontal signal line 32, the pixel signal on which signal processing has been performed.

The output circuit 27 performs signal processing on the pixel signal sequentially supplied from each of the column signal processing circuit 25 via the horizontal signal line 32 and outputs the pixel signal. As the signal processing, for example, buffering, black level adjustment, column variation correction, various types of signal processing, and the like can be used.

The control circuit 28 generates, on the basis of a vertical synchronization signal, a horizontal synchronization signal, and a master clock signal, a clock signal and a control signal that serve as a reference for the operations of the vertical drive circuit 24, the column signal processing circuit 25, the horizontal drive circuit 26, and the like. Then, the control circuit 28 outputs the generated clock signal and the generated control signal to the vertical drive circuit 24, the column signal processing circuit 25, the horizontal drive circuit 26, and the like.

<Schematic Configuration of Pixel Unit>

Figure 22:
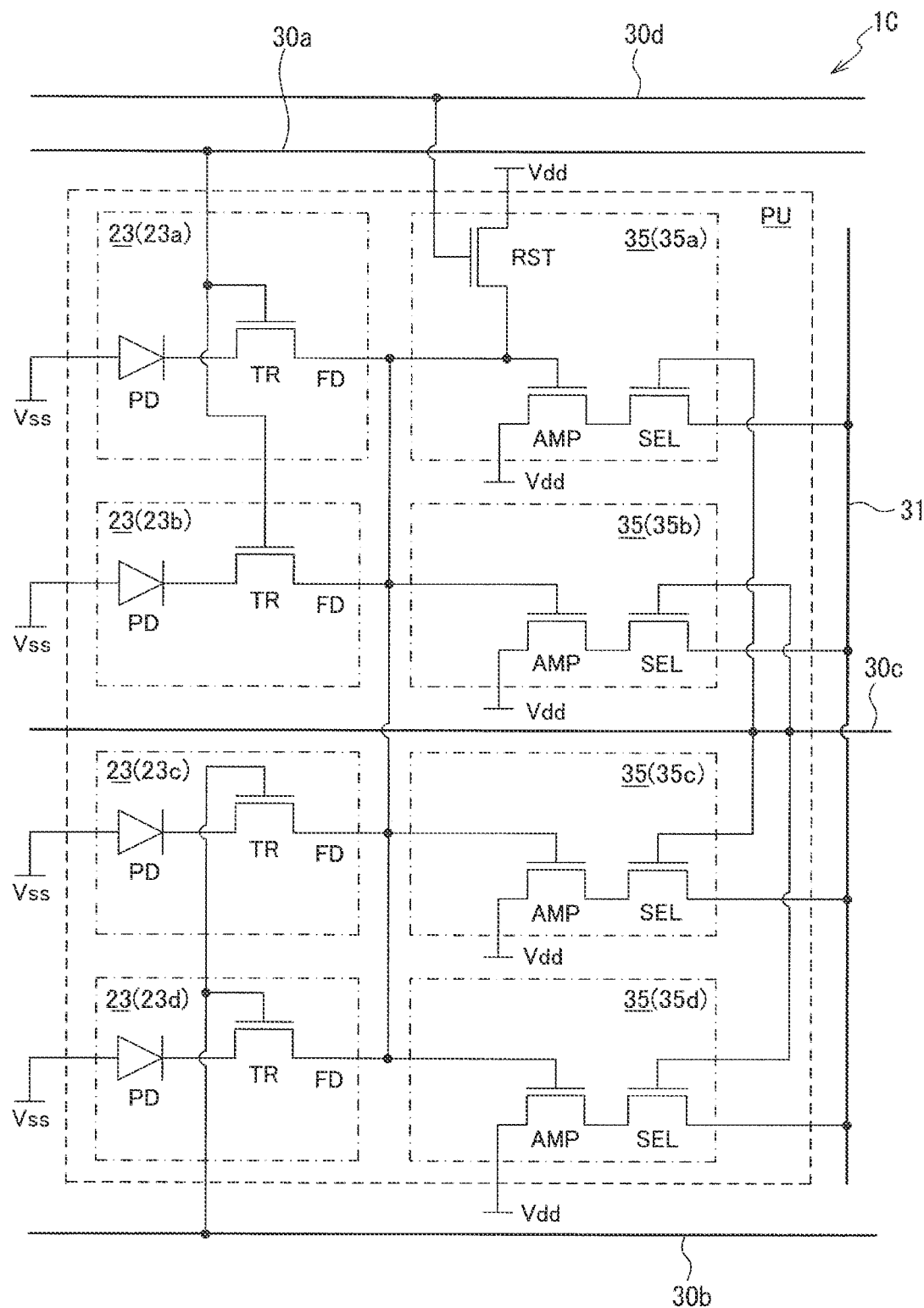
FIG. 22 is an equivalent circuit diagram showing a configuration example of a pixel and a readout circuit of the solid-state imaging device according to the fourth embodiment of the present technology.

A pixel unit PU shown in FIG. 22 and FIG. 24 is formed in the pixel region 20A. The pixel unit PU includes the plurality of pixels 23 and a plurality of readout circuits 35 provided for each pixel 23 of the plurality of pixels 23. In this fourth embodiment, the pixel unit PU includes, for example, four pixels 23 (23a, 23b, 23c, 23d) arranged in a 2×2 array in the respective directions of the X direction and the Y direction in plan view and four readout circuits 35 (35a, 35b, 35c, 35d) provided for each of the four pixels 23. Although FIG. 22 illustrates one pixel unit PU and FIG. 24 illustrates two pixel units PU, the pixel units PU are repeatedly arranged in the respective directions of the X direction and the Y direction in the pixel region 20A.

As shown in FIG. 22, each of the two pixels 23a and 23b, of the four pixels 23, includes a photoelectric conversion device PD, a transfer transistor TR connected to this photoelectric conversion device PD, and a charge holding region (floating diffusion) FD that temporarily holds the signal charges output from the photoelectric conversion device PD via this transfer transistor TR. Then, each of the remaining two pixels 23c and 23d includes the photoelectric conversion device PD, the transfer transistor TR connected to this photoelectric conversion device PD, and the charge holding region FD that temporarily holds the signal charges output from the photoelectric conversion device PD via this transfer transistor TR.

The transfer transistor TR of the four pixels 23 has a vertical gate structure in which a gate electrode 8M described below extends in the depth direction of the semiconductor layer 40 (see FIG. 25 and FIG. 23). Then, the transfer transistor TR includes, for example, a MOSFET. Further, as the transfer transistor TR, a MISFET may be used. The charge holding region FD includes the main electrode region 12a described below. The transfer transistor TR has a pair of main electrode regions, similarly to the transistor included in the readout circuit 35.

As shown in FIG. 22, in the two pixels 23a and 23b, the photoelectric conversion device PD has a cathode side electrically connected to one main electrode region of the transfer transistor TR and an anode side electrically connected to a reference potential line (e.g., a ground line) Vss. The other main electrode region of the transfer transistor TR is electrically connected to the charge holding region FD and the gate electrode of the transfer transistor TR is electrically connected to a first transfer transistor drive line 30a of the pixel drive lines 30.

As shown in FIG. 22, in the two pixels 23c and 23d, the photoelectric conversion device PD has a cathode side electrically connected to the one main electrode region of the transfer transistor TR and an anode side electrically connected to the reference potential line (e.g., a ground line) Vss. The other main electrode region of the transfer transistor TR is electrically connected to the charge holding region FD and the gate electrode of the transfer transistor TR is electrically connected to a second transfer transistor drive line 30b of the pixel drive lines 30.

Each of the four readout circuits 35 individually reads the signal charges generated in each of the four photoelectric conversion devices PD.

Of the four readout circuits 35, three readout circuits 35b, 35c, and 35d have similar circuit configurations and the remaining one readout circuit 35a has a different circuit configuration. Specifically, each of the three readout circuits 35b, 35c, and 35d includes, as a plurality of transistors, an amplifier transistor AMP and a selection transistor SEL. Then, the one readout circuit 35a includes, as a plurality of transistors, the amplifier transistor AMP, the selection transistor SEL, and a reset transistor RTR. These transistors (AMP, SEL, and RST) have different sizes but have a configuration similar to that in the field-effect transistor Q according to the above-mentioned first embodiment. That is, in this fourth embodiment, the present technology is applied to each of the transistors AMP, SEL, and RST included in the readout circuit 35.

In the four readout circuits 35 (35a, 35b, 35c, and 35d), the amplifier transistor AMP has one main electrode region electrically connected to one main electrode region of the selection transistor SEL and the other main electrode region electrically connected to the power supply line Vdd. Then, the gate electrode of the amplifier transistor AMP is individually electrically connected to the charge holding region FD of the corresponding pixel 23 (23a, 23b, 23c, 23d).

In the four readout circuits 35 (35a, 35b, 35c, and 35d), the selection transistor SEL has the one main electrode region electrically connected to the one main electrode region of the amplifier transistor AMP and the other main electrode region electrically connected to the vertical signal line 31 (VSL). Then, the gate electrode of the selection transistor SEL is electrically connected to a selection transistor drive line 30c of the pixel drive lines 30.

The reset transistor RST of the one readout circuit 35a has one main electrode region electrically connected to the gate electrode of the amplifier transistor AMP of each of the four readout circuits 35 (35a, 35b, 35c, and 35d) and the charge holding region FD of each of the four pixels 23 (23a, 23b, 23c, and 23d) and the other main electrode region electrically connected to the power supply line Vdd. Then, the gate electrode of the reset transistor RST is electrically connected to a reset transistor drive line 30d of the pixel drive lines 30.

In one pixel unit PU, when the transfer transistor TR of each pixel 23 transfers, when being turned on, the signal charges of the photoelectric conversion device PD to the charge holding region FD. The reset transistor RST resets, when being turned on, the signal potential of the charge holding region FD of each of the four pixels 23 to the potential of the power supply line Vdd. The selection transistor SEL of each pixel 23 controls the output timing of the pixel signal from each readout circuit 35.

The amplifier transistor AMP of each readout circuit 35 generates, as a pixel signal, a signal of a voltage corresponding to the level of the signal charges held in the charge holding region FD. The amplifier transistor AMP constitutes a source follower amplifier and outputs a pixel signal of a voltage corresponding to the level of the signal charges generated in the photoelectric conversion device PD. The amplifier transistor AMP amplifies, when the selection transistor SEL is turned on, the signal charges of the charge holding region FD and outputs a voltage corresponding to the signal charges to the column signal processing circuit 25 via the vertical signal line 31. That is, the readout circuit 35 outputs a pixel signal based on the signal charges output from the photoelectric conversion device PD of the pixel 23.

<Specific Configuration of Solid-State Imaging Device>

Figure 23:
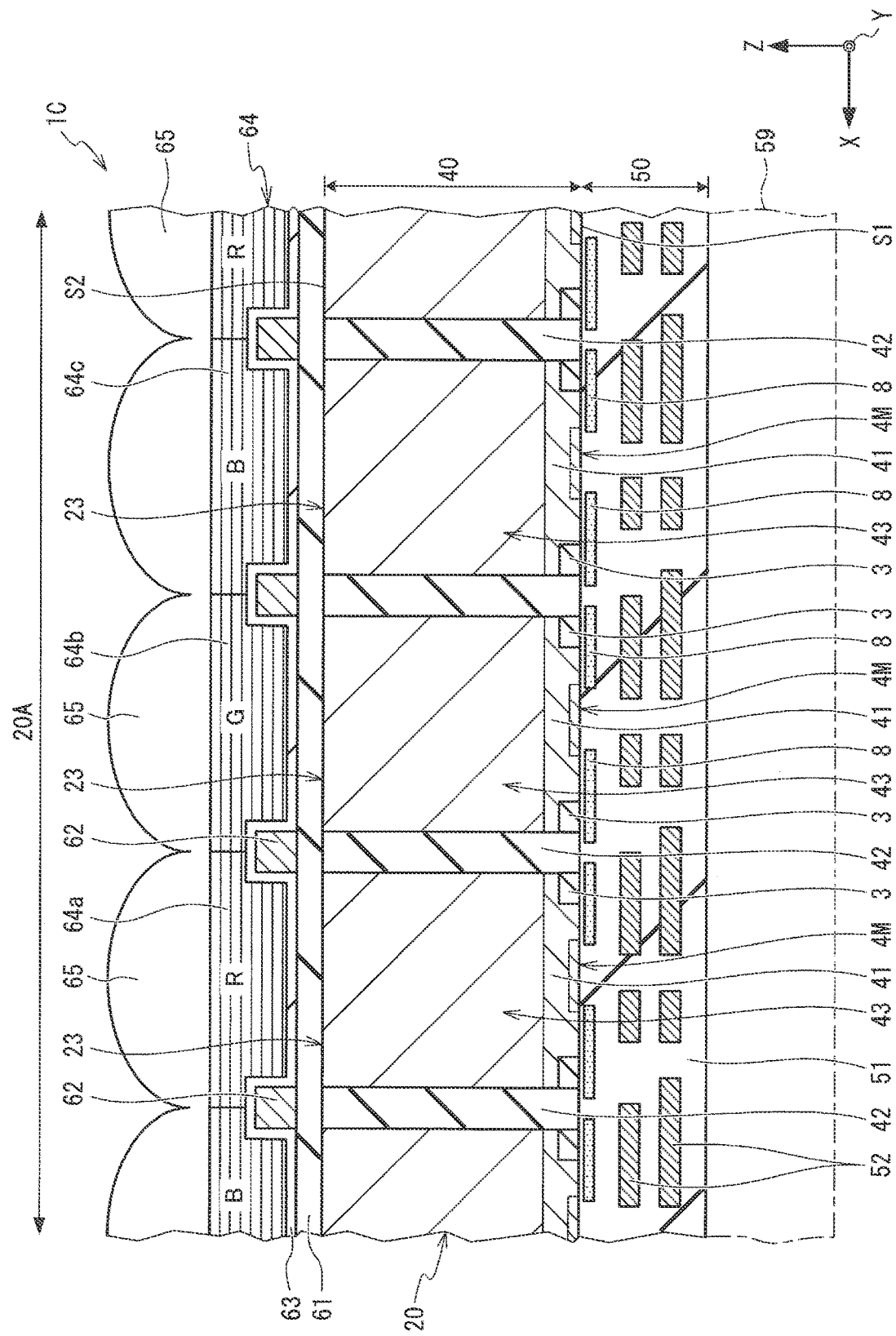
FIG. 23 is a schematic cross-sectional view of a main portion showing a cross-sectional structure of a pixel region.
Figure 24:
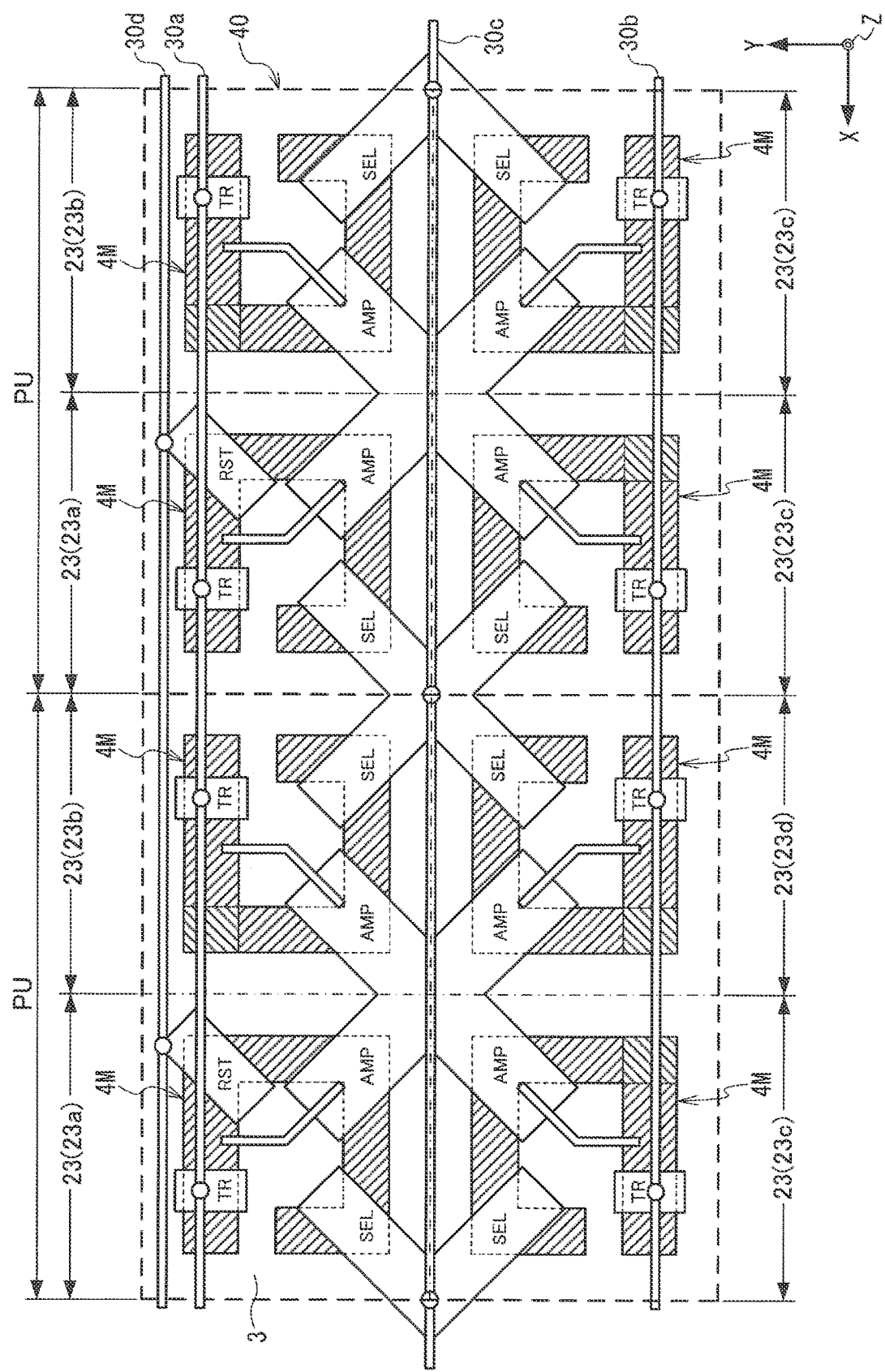
FIG. 24 is a schematic plan view of a main portion showing disposition of transistors in pixel units.

As shown in FIG. 23, the semiconductor chip 20 includes the semiconductor layer 40 in which a plurality of photoelectric conversion units 43 is provided and a color filter layer 64 that is disposed on the light incident surface side that is the side of a second surface S2, of the first surface S1 and the second surface S2 positioned on mutually opposite sides in the thickness direction of this semiconductor layer 40.

Further, the semiconductor chip 20 further includes a plurality of microlenses 65 (on-chip lens, wafer lens) disposed on the light incident surface side of the color filter layer 64 (side opposite to the side of the semiconductor layer 40).

Further, the semiconductor chip 20 further includes a multilayer wiring layer 50 disposed on the side of the first surface S1 of the semiconductor layer 40 and a support substrate 59 disposed on the side opposite to the side of the semiconductor layer 40 of this multilayer wiring layer 50.

Here, the first surface S1 of the semiconductor layer 40 is referred to also as an element formation surface or a main surface, and the second surface S2 is referred to as a light incident surface or a back surface in some cases.

The semiconductor layer 40 includes, for example, an n-type semiconductor substrate formed of single crystal silicon. Each photoelectric conversion unit 43 of the plurality of photoelectric conversion units 43 is arranged in a matrix corresponding to the pixel 23 of the plurality of pixels 23 in the pixel region 20A. Then, each photoelectric conversion unit 43 is demarcated by a photoelectric-conversion-unit separation region 42 provided in the semiconductor layer 40. The photoelectric-conversion-unit separation region 42 extends from the side of the first surface S1 of the semiconductor layer 40 to the side of the second surface S2 to electrically and optically separate the photoelectric conversion units 43 adjacent to each other from each other. The photoelectric-conversion-unit separation region 42 can have, for example, a single-layer structure including a silicon oxide film or a three-layer structure sandwiching both sides of a metal film by an insulation film. The photoelectric conversion unit 43 generates signal charges corresponding to the amount of incident light and accumulates the generated signal charges.

A well region 41 including, for example, a p-type semiconductor region is formed in each photoelectric conversion unit 43 of the plurality of photoelectric conversion units 43. Further, the photoelectric conversion device PD shown in FIG. 22 is formed in each photoelectric conversion unit 43 of the plurality of photoelectric conversion units 43. As the photoelectric conversion device PD, for example, an avalanche photo diode (APD) element is formed. That is, in the pixel region 20A, a plurality of pixels 23 each including the photoelectric conversion unit 43 embedded in the semiconductor layer 40 is arranged in a matrix (two-dimensional matrix).

The multilayer wiring layer 50 is disposed on the side of the first surface S1 opposite to the side of the light incident surface (second surface S2) of the semiconductor layer 40 and includes an interlayer insulating film 51 and a wire 52 including a plurality of layers stacked via the interlayer insulating film 51. The transfer transistor TR and the plurality of transistors (AMP, SEL, and RST) included in the readout circuit 35 are driven via the wire 52 including a plurality of layers. Since the multilayer wiring layer 50 is disposed on the side of the semiconductor layer 40 opposite to the light incident surface side (the side of the second surface S2), it is possible to freely set the layout of the wire 52.

The color filter layer 64 is provided mainly in an effective pixel region of the pixel region 20A. The color filter layer 64 includes, for example, a red (R first color filter portion 64*a*, a green (G) second color filter portion 64*b*, and a blue (B) third color filter portion 64*c*. The first to third color filter portions 64*a* to 64*c* are arranged in a matrix corresponding to the respective pixels 23 of the plurality of pixels 23. Each of the red (R) first color filter portion 64*a*, the green (G) second color filter portion 64*b*, and the blue (B) third color filter portion 64*c* is configured to cause a wavelength of incident light that is to be received by the photoelectric conversion unit 43 to be transmitted therethrough and cause the transmitted incident light to enter the photoelectric conversion unit 43.

Each microlens 65 of the plurality of microlenses 65 is arranged in a matrix corresponding to each pixel 23 of the plurality of pixels 23, i.e., each photoelectric conversion unit 43 of the plurality of photoelectric conversion units 43, in the pixel region 20A. The microlens 65 collects irradiation light and causes the collected light to efficiently enter the photoelectric conversion unit 43 of the semiconductor layer 40 via the color filter layer 64. The plurality of microlenses 65 constitutes a microlens array on the light incident surface side of the color filter layer 64. The microlens 65 is formed of, for example, a material such as styrene.

The support substrate 59 is provided on the surface of the multilayer wiring layer 50 on the side opposite to the side facing the semiconductor layer 40. The support substrate 59 is a substrate for achieving the strength of the semiconductor layer 40 in the stage of producing the solid-state imaging device 1C. As the material of the support substrate 59, for example, silicon (Si) can be used.

A flattening film 61, a light-shielding film 62, and an adhesive film 63 are stacked in this order from the side of the semiconductor layer 40 between the semiconductor layer 40 and the color filter layer 64.

The flattening film 61 covers the entire light incident surface side of the semiconductor layer 40 in the pixel region 20A such that the light incident surface side of the semiconductor layer 40 has a flat surface without recesses and projections. As the flattening film 61, for example, a silicon oxide ($SiO_2$) film can be used.

The light-shielding film 62 has a grid-like planar pattern in which the planar pattern in plan view opens the light-receiving surface side of each of the plurality of photoelectric conversion units 43 such that light of a predetermined pixel 23 does not leak into the adjacent pixel 23. As this light-shielding film 62, for example, a tungsten (W) film is used.

The adhesive film 63 is disposed between the flattening film 61 and the color filter layer 64 and between the light-shielding film 62 and the color filter layer 64, and mainly enhances the adhesion between the light-shielding film 62 and the color filter layer 64. As the adhesive film 63, for example, a silicon oxide film is used.

As shown in FIG. 23 and FIG. 24, an active region 4M demarcated by the separation region 3 is provided on the side of the first surface S1 of the semiconductor layer 40. The active region 4M is provided for each pixel 23.

Figure 25:
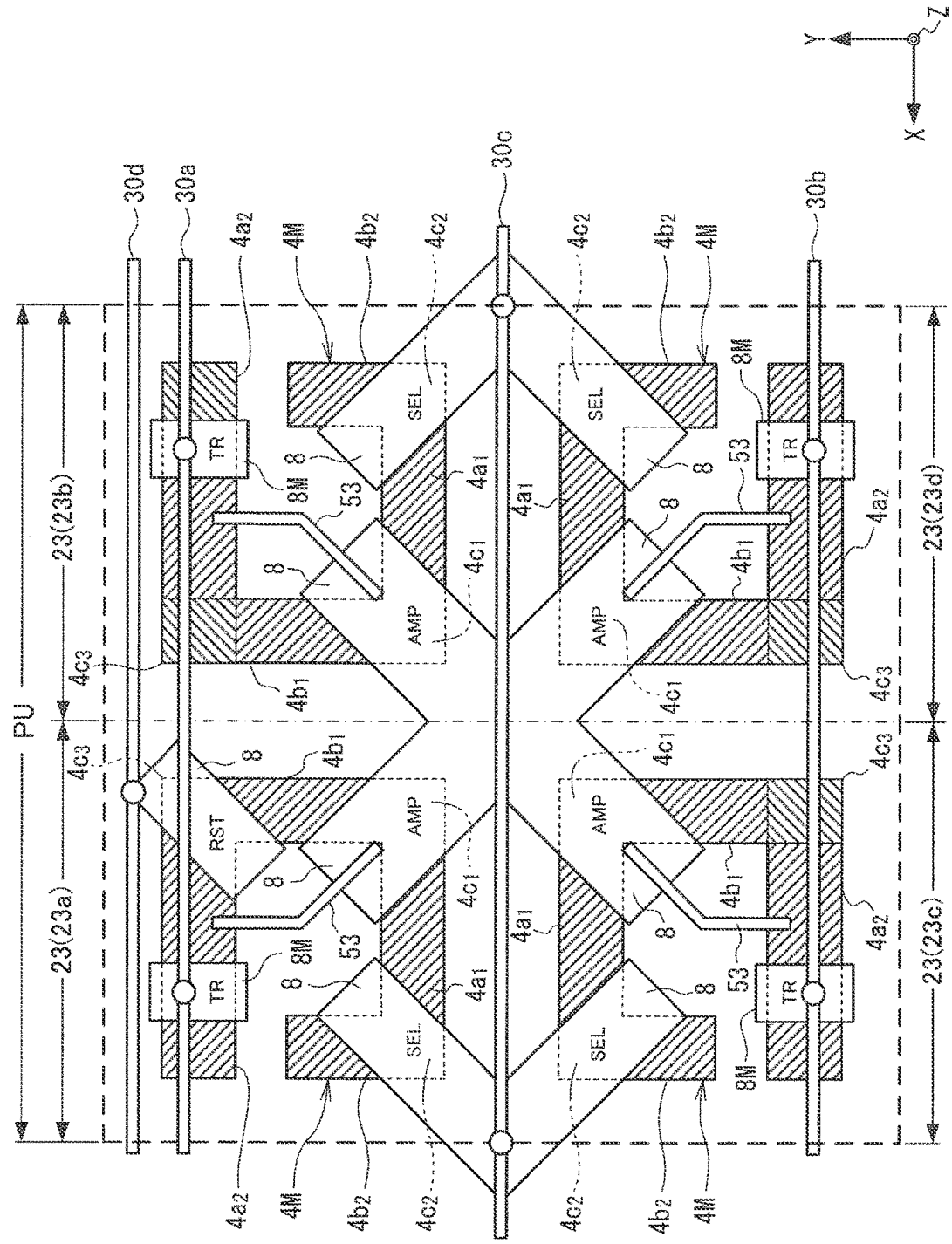
FIG. 25 is a schematic plan view of a main portion showing disposition of transistors in one pixel unit.

As shown in FIG. 24 and FIG. 25, in the active region 4M of the pixel 23*a*, the transistors (AMP, SEL, and RST) included in the readout circuit 35*a* are formed and the transfer transistor TR of the pixel 23*a* is formed. In the active region 4M of each of the pixels 23*b*, 23*c*, and 23*d*, respectively, the transistors (AMP and SEL) included in the readout circuits 35*b*, 35*c*, and 35*d* are individually formed and the transfer transistors TR of the pixels 23*b*, 23*c*, and 23*d* are individually formed. In these transistors (AMP, SEL, and RST), the channel region 6 and the pair of main electrode regions 12*a* and 12*b* are provided in the well region 41.

As shown in FIG. 25, the active region 4M includes two first portions 4*a*1 and 4*a*2 that extend in the X direction and are separated from each other facing each other in the Y direction, and the two second portions 4*b*1 and 4*b*2 that extend in the Y direction and are separated from each other facing each other in the X direction. The second portion 4*b*1 has one end side connected to one end side of the first portion 4*a*1 via the corner 4*c*1 so as to relatively bend and the other end side connected to one end side of the first portion 4*a*2 via a corner 4*c*3 so as to relatively bend. The second portion 4*b*2 has one end side connected to the other end side of the first portion 4*a*1 via the corner 4*c*2 and the other end side that is separated from the other end side of the first portion 4*a*2 and terminated. That is, the active region 4M according to this fourth embodiment has a C-shaped planar pattern.

As shown in FIG. 25, planar patterns of the active region 4M of the pixel 23*a* and the active region 4M of the pixel 23*b* include reversed patterns with the boundary between the pixel 23*a* and the pixel 23*b* as a reverse axis. Further, planar patterns of the active region 4M of the pixel 23*b* and the active region 4M of the pixel 23*d* include reversed patterns with the boundary between the pixel 23*b* and the pixel 23*d* as a reverse axis. Further, planar patterns of the active region 4M of the pixel 23*d* and the active region 4M of the pixel 23*c* include reversed patterns with the boundary between the pixel 23*d* and the pixel 23*c* as a reverse axis. Then, planar patterns of the active region 4M of the pixel 23*c* and the active region 4M of the pixel 23*a* include reversed patterns with the boundary between the pixel 23*c* and the pixel 23*a* as a reverse axis.

Figure 26:
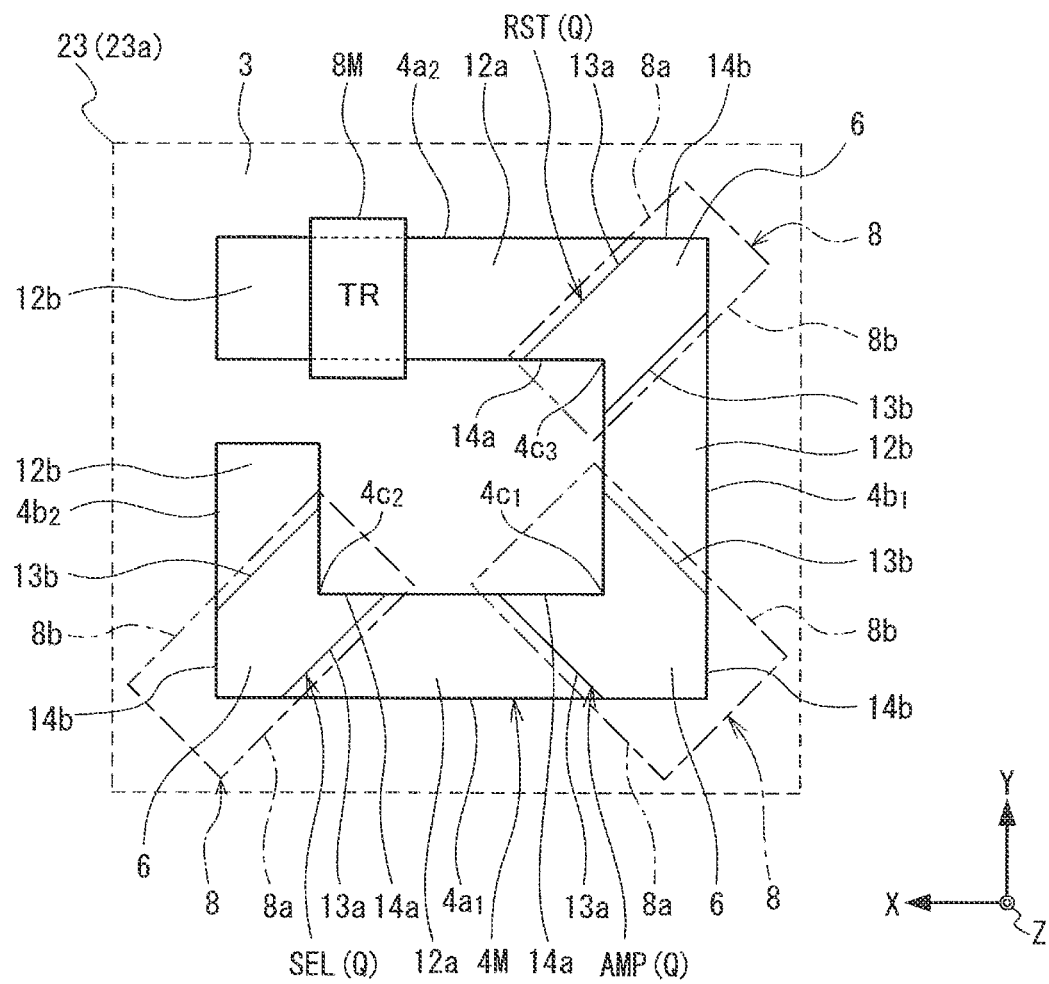
FIG. 26 is a diagram showing a positional relationship between an active region, a gate electrode, and a channel boundary portion.

As shown in FIG. 25 and FIG. 26, regarding the transistors (AMP, SEL, RST, and TR) formed in the active region 4M of the pixel 23*a*, the amplifier transistor AMP is disposed at the corner 4*c*1 of the active region 4M, the selection transistor SEL is disposed at the corner 4*c*2 of the active region 4M, and the reset transistor RST is disposed at the corner 4*c*3 of the active region 4M. Then, the transfer transistor TR is disposed in the first portion 4*a*2 of the active region 4.

As shown in FIG. 26, in the gate electrode 8 of the amplifier transistor AMP, the first side 8*a* and the second side 8*b* positioned on mutually opposite sides extend parallel to each other and are inclined at an angle of 45 degrees with respect to the respective extending directions (the X direction and the Y direction) of the first portion 4*a*1 and the second portion 4*b*1 of the active region 4M.

In the gate electrode 8 of the selection transistor SEL, the first side 8*a* and the second side 8*b* positioned on mutually opposite sides extend parallel to each other and are inclined at an angle of 45 degrees with respect to the respective extending directions (the X direction and the Y direction) of the first portion 4*a*1 and the second portion 4*b*2 of the active region 4M.

In the gate electrode 8 of the reset transistor RST, the first side 8*a* and the second side 8*b* positioned on mutually opposite sides extend parallel to each other and are inclined at an angle of 45 degrees with respect to the respective extending directions (the X direction and the Y direction) of the first portion 4a2 and the second portion 4b1 of the active region 4M.

The amplifier transistor AMP and the selection transistor SEL share the main electrode region 12a. The amplifier transistor AMP and the reset transistor RST share the main electrode region 12b. The reset transistor RST and the transfer transistor TR share the main electrode region 12a. Then, in the selection transistor SEL and the transfer transistor TR, the corresponding main electrode region 12b is individually provided.

As shown in FIG. 26, in each of the amplifier transistor AMP, the selection transistor SEL, and the reset transistor RST, the first channel boundary portion 13a is inclined at, for example, an angle of 45 degrees with respect to the extending direction (X direction) of the first portions 4a1 and 4a2 of the active region 4M and the second channel boundary portion 13b is inclined at, for example, an angle of 45 degrees with respect to the extending direction (Y direction) of the second portions 4b1 and 4b2 of the active region 4M, similarly to the field-effect transistor Q according to the above-mentioned first embodiment although not limited thereto. Then, the length A1 of the channel region inner boundary portion 14a and the length B1 of the channel region outer boundary portion 14b are equal to each other (A1=B1).

Figure 27:
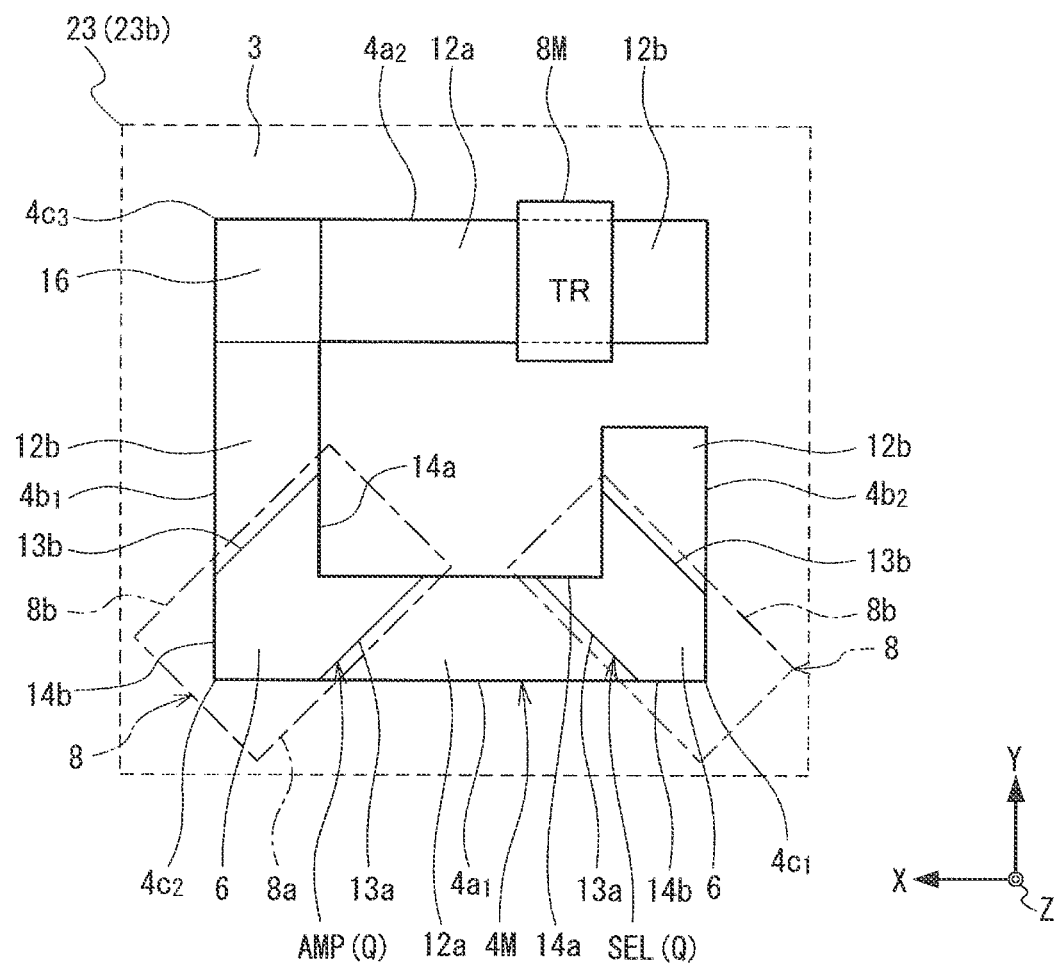
FIG. 27 is a diagram showing a positional relationship between an active region, a gate electrode, and a channel boundary portion.

As shown in FIG. 25 and FIG. 27, the amplifier transistor AMP, the selection transistor SEL, and the reset transistor RST formed in the pixel 23b are provided in the active region 4 in the disposition similar to that of the amplifier transistor AMP, the selection transistor SEL, and the reset transistor RST in the pixel 23a shown in FIG. 26. Then, also the transistors (AMP, SEL, and TR) formed in each of the pixels 23c and 23d are provided in the active region 4M in the disposition similar to that of the transistors (AMP, SEL, and TR) in the pixel 23a. For this reason, description of the disposition of the transistors (AMP, SEL, and TR) in the pixels 23b, 23c, and 23d is omitted.

The main electrode region 12a of each of the transfer transistor TR and the reset transistor RST in the pixel 23a shown in FIG. 26 functions as the charge holding region FD. The main electrode region 12a of the transfer transistor TR in the pixel 23b shown in FIG. 27 functions as the charge holding region FD. Then, as shown in FIG. 25, this main electrode region 12a of each of the transfer transistor TR and the reset transistor RST is electrically connected to the gate electrode 8 of the amplifier transistor AMP via a relay wire 53. Then, in the pixel unit PU, the amplifier transistors AMP of the adjacent four pixels 23 (23a, 23b, 23c, and 23d) include the respective gate electrodes 8 integrally formed. The respective gate electrodes 8 are integrated at the boundary point where the four pixels 23a, 23b, 23c, and 23d are adjacent to each other to form an X-shaped planar pattern. The relay wire 53 is provided in the multilayer wiring layer 50.

As shown in FIG. 24 and FIG. 25, in the two pixel units PU and PU, the selection transistors SEL of the four pixels 23 (23a, 23b, 23c, and 23d) adjacent to each other include the respective gate electrodes 8 integrally formed. The respective gate electrodes 8 are integrated at the boundary point where the four pixels 23a, 23b, 23c, and 23d are adjacent to each other to form an X-shaped planar pattern.

As shown in FIG. 25, the gate electrode 8M of the transfer transistor TR of each of the two pixels 23a and 23b is electrically connected to the first transfer transistor drive line 30a. Further, the gate electrode 8M of the transfer transistor TR of each of the two pixels 23c and 23d is electrically connected to the second transfer transistor drive line 30b. Further, the gate electrode 8 of the selection transistor SEL of each of the four pixels 23a, 23b, 23c, and 23d is electrically connected to the selection transistor drive line 30c. Further, the gate electrode 8 of the reset transistor RST in the pixel 23a is electrically connected to the reset transistor drive line 30d.

In FIG. 26, the main electrode region 12b shared by the amplifier transistor AMP and the reset transistor RST is electrically connected to the power supply line Vdd although not shown in detail. The main electrode region 12b of the selection transistor SEL is electrically connected to the vertical signal line (VSL) 13. The main electrode region 12b of the transfer transistor TR is electrically connected to the reference potential line Vss.

In FIG. 26, the main electrode region 12b of the amplifier transistor AMP is electrically connected to the power supply line Vdd although not shown in detail. The main electrode region 12b of the selection transistor SEL is electrically connected to the vertical signal line (VSL) 31. The main electrode region 12b of the transfer transistor TR is electrically connected to the reference potential line Vss.

Here, as shown in FIG. 27, in the pixel 23b, a well-potential-supplying contact region 16 for supplying a potential to the well region 41 (see FIG. 23) is provided at the corner 4c3 of the active region 4. This well-potential-supplying contact region 16 includes a p-type semiconductor region that is of a conductive type opposite to those of the main electrode region 12b of the amplifier transistor AMP and the main electrode region 12a of the transfer transistor TR. This well-potential-supplying contact region 16 is provided also in the pixels 23c and 23d.

In the solid-state imaging device 1C according to this fourth embodiment, the amplifier transistor AMP, the selection transistor SEL, and the reset transistor RST have configurations similar to those of the field-effect transistor Q according to the above-mentioned first embodiment. Therefore, also in the solid-state imaging device 1C according to this fourth embodiment, effects similar to those in the semiconductor device 1 according to the above-mentioned first embodiment can be achieved. Then, in this fourth embodiment, since it is possible to reduce the noise of the amplifier transistor AMP, the selection transistor SEL, and the reset transistor RST included in the readout circuit 35 and increase the mutual inductance, it is possible to improve the noise properties of the amplifier transistor AMP and improve the on-resistance of the selection transistor SEL and the reset transistor RST.

Further, in the solid-state imaging device 1C according to this fourth embodiment, since the amplifier transistor AMP, the selection transistor SEL, and the reset transistor RST are disposed at the corner 4c1, 4c2, and 4c3 of the active region M, it is possible to reduce the area for disposing transistors and miniaturizing the pixel 23 as compared with the case where two transistors of the amplifier transistor AMP, the selection transistor SEL, and the reset transistor RST are linearly disposed.

Modified Example of Fourth Embodiment

Note that the first modified example to the fifth modified example of the above-mentioned first embodiment can be applied also to this fourth embodiment.

That is, in the amplifier transistor AMP, the selection transistor SEL, and the reset transistor RST, one of the first channel boundary portion 13a and the second channel boundary portion 13b may be orthogonal to the extending direction (X direction) of the first portions 4a1 and 4a2 of the active region 4 and the other may be inclined with respect to the extending direction (Y direction) of the second portions 4b1 and 4b2 of the active region 4M.

Further, referring to FIG. 16A and FIG. 16B, in the amplifier transistor AMP, the selection transistor SEL, and the reset transistor RST, the gate electrode 8 may have a shape in which chamfered portions are provided at the two corners located on the outer side of the corner 4c and may have a round shape or an arc shape.

Further, the junction-type separation structure according to the above-mentioned second embodiment can be applied also to this fourth embodiment.

Figure 28:
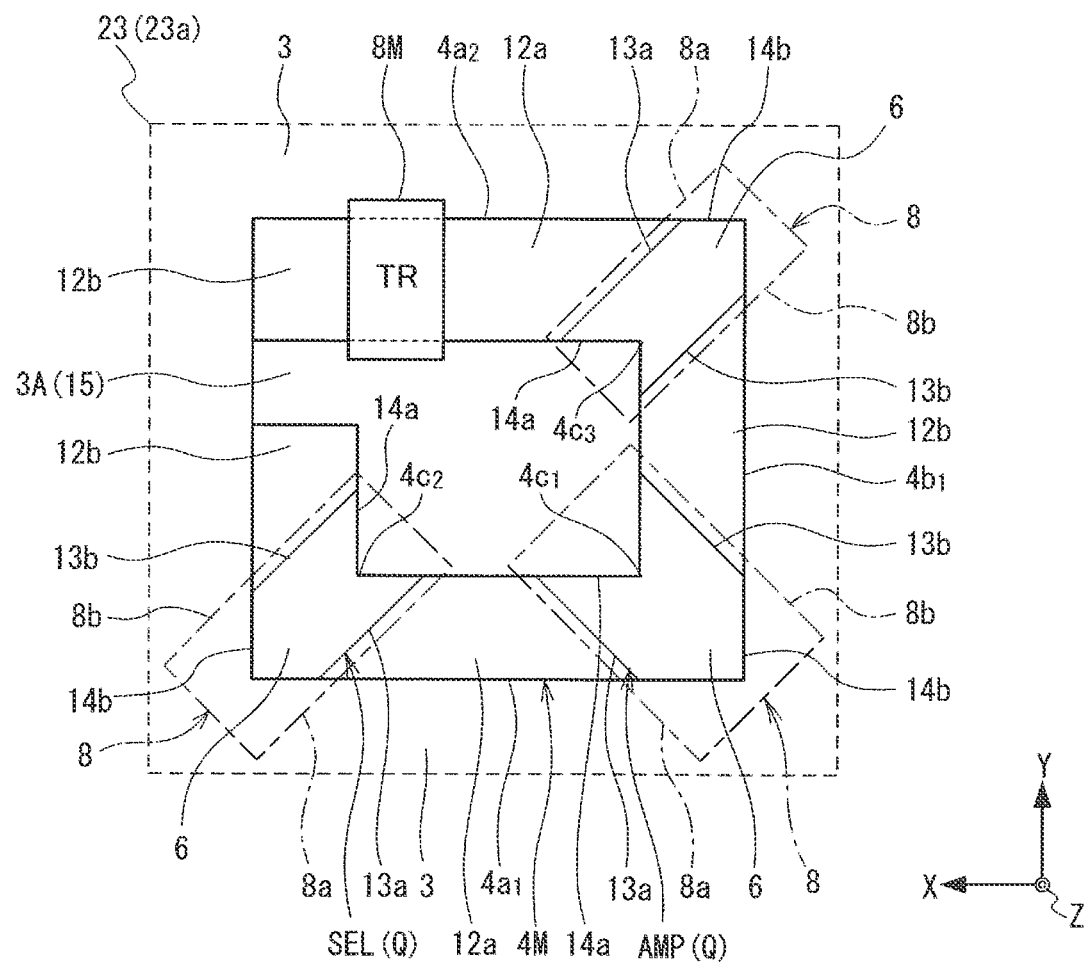
FIG. 28 is a schematic plan view of a main portion showing a modified example of the solid-state imaging device according to the fourth embodiment of the present technology.

That is, as shown in FIG. 28, in the active region 4M, the separation region 3A in contact with the inner side of the channel region 6 may include the p-type semiconductor region 15 provided in the semiconductor layer 40.

Further, although the case where the amplifier transistor AMP, the selection transistor SEL, and the reset transistor RST have configurations similar to those of the field-effect transistor Q according to the above-mentioned first embodiment has been described in this fourth embodiment, at least one of the plurality of transistors included in the readout circuit 35 may have a configuration similar to that of the field-effect transistor Q according to the above-mentioned first embodiment.

Fifth Embodiment

<<Application Example to Electronic Apparatus>>

The present technology (technology according to the present disclosure) can be applied to various electronic apparatuses such as an imaging apparatus such as a digital still camera and a digital video camera, a mobile phone having an imaging function, and other devices having an imaging function.

FIG. 29 is a diagram showing a schematic configuration of an electronic apparatus (e.g., a camera) according to a fifth embodiment of the present technology.

As shown in FIG. 29, an electronic apparatus 100 includes a solid-state imaging device 101, the optical lens 102, a shutter device 103, a drive circuit 104, and a signal processing circuit 105. This electronic apparatus 100 shows an embodiment in the case of using, as the solid-state imaging device 101, the solid-state imaging device 1C according to the fifth embodiment of the present technology in an electronic apparatus (e.g., a camera).

The optical lens 102 forms image light from a subject (incident light 106) on an imaging surface of the solid-state imaging device 101. As a result, signal charges are accumulated in the solid-state imaging device 101 for a certain period of time. The shutter device 103 controls the light irradiation period and the light shielding period for the solid-state imaging device 101. The drive circuit 104 supplies drive signals for controlling the transfer operation of the solid-state imaging device 101 and the shutter operation of the shutter device 103. The signal transfer of the solid-state imaging device 101 is performed by the drive signal (timing signal) supplied from the drive circuit 104. The signal processing circuit 105 performs various types of signal processing on the signal (pixel signal) output from the solid-state imaging device 101. The video signal on which signal processing has been performed is stored in a storage medium such as a memory, or is output to a monitor.

With such a configuration, in the electronic apparatus 100 according to the fifth embodiment, since light reflection in the light-shielding film and the insulation film in contact with an air layer is suppressed by a light-reflection suppression unit in the solid-state imaging device 101, it is possible to suppress a shake and improve the image quality.

Note that the electronic apparatus 100 to which the solid-state imaging device 1C can be applied is not limited to a camera and the solid-state imaging device 1C can be applied also to other electronic apparatuses. For example, the solid-state imaging device 1C may be applied to an imaging device such as a camera module for mobile devices such as mobile phones and tablet terminals.

it should be noted that the present technology may also take the following configurations.

(1) A semiconductor device, including:
  a semiconductor layer having an active region demarcated by a separation region; and
  a field-effect transistor in which a pair of main electrode regions sandwiching a channel region are provided in the active region and a gate electrode is provided on the channel region,
  the active region having a first portion extending in one direction in plan view and a second portion extending from the first portion in a direction crossing the one direction,
  the channel region being provided across the first portion and the second portion,
  one of the pair of main electrode regions being provided in the first region in contact with the channel region, the other being provided in the second region in contact with the channel region, the pair of main electrode regions being positioned on mutually opposite sides sandwiching the channel region.

(2) The semiconductor device according to (1) above, further including:
  a first channel boundary portion between the one main electrode region and the channel region; and
  a second channel boundary portion between the other main electrode region and the channel region, in which
  each of the first and second channel boundary portions linearly extends.

(3) The semiconductor device according to (1) above, further including:
  a first channel boundary portion between the one main electrode region and the channel region; and
  a second channel boundary portion between the other main electrode region and the channel region, in which
  the first channel boundary portion linearly extends and is orthogonal to an extending direction of the first portion, and
  the second channel boundary portion linearly extends and is inclined with respect to an extending direction of the second portion.

(4) The semiconductor device according to (1) above, further including:
  a first channel boundary portion between the one main electrode region and the channel region; and
  a second channel boundary portion between the other main electrode region and the channel region, in which,
  the first and second channel boundary portions linearly extend parallel to each other.

(5) The semiconductor device according to (1) above, in which
  a first boundary portion between the one main electrode region and the channel region and a second boundary portion between the other main electrode region and the channel region linearly extend and are inclined at 45 degrees with respect to respective extending directions of the first portion and the second portion in the active region.
(6) The semiconductor device according to any one of (1) to (5) above, in which
a length of a channel region inner boundary portion between an inner side of the channel region and the separation region and a length of a channel region outer boundary portion between an outer side of the channel region and the separation region are equivalent to each other.
(7) The semiconductor device according to any one of (2) to (6) above, in which
the gate electrode has a first side crossing the first portion in plan view and a second side that is positioned on a side opposite to the first side and crosses the second portion,
the first channel boundary portion is formed by self-alignment with respect to a side of the first side of the gate electrode, and
the second channel boundary portion is formed by self-alignment with respect to a side of the second side of the gate electrode.
(8) The semiconductor device according to any one of (1) to (7) above, in which
a separation region in contact with an inner side of the channel region of the separation region includes a semiconductor region provided in the semiconductor layer.
(9) The semiconductor device according to any one of (1) to (8) above, in which
the first portion and the second portion of the active region are orthogonal to each other.
(10) The semiconductor device according to any one of (1) to (9) above, further including:
a photoelectric conversion device that performs photoelectric conversion; and
a readout circuit that reads signal charges photoelectrically converted by the photoelectric conversion device, in which
at least one of a plurality of transistors included in the readout circuit includes the field-effect transistor.
(11) An electronic apparatus, including:
a semiconductor device;
an optical lens that forms an image of image light from a subject on an imaging surface of the semiconductor device; and
a signal processing circuit that performs signal processing on a signal output from the semiconductor device,
the semiconductor device including
a semiconductor layer having an active region demarcated by a separation region, and
a field-effect transistor in which a pair of main electrode regions sandwiching a channel region are provided in the active region and a gate electrode is provided on the channel region,
the active region having a first portion extending in one direction in plan view and a second portion extending from the first portion in a direction crossing the one direction,
the channel region being provided across the first portion and the second portion,
one of the pair of main electrode regions being provided in the first region in contact with the channel region, the other being provided in the second region in contact with the channel region, the pair of main electrode regions being positioned on mutually opposite sides sandwiching the channel region.

The scope of the present technology is not limited to the illustrated and described exemplary embodiments and includes all embodiments that provide effects equivalent to those aimed by the present technology. Further, the scope of the present technology is not limited to the combination of features of the invention defined by the claims and may be defined by desired combinations of specific features of all disclosed features.

REFERENCE SIGNS LIST 1,1A,1B semiconductor device
1C solid-state imaging device
2 semiconductor layer
3 separation region
4 active region
4a first portion, 4b second portion
5a inner edge, 5b outer edge
$5a_1$ gate electrode-superimposed inner edge, $5b_1$ gate electrode-superimposed outer edge
6 channel region
7 gate insulating film
8 gate electrode
8a first side, 8b second side
9 extension region
10 sidewall spacer
11 contact region
12a, 12b main electrode region
13a first channel boundary portion
13b second channel boundary portion
14a a channel region inner boundary portion
14b a channel region outer boundary portion
15 p-type semiconductor region
16 well-potential-supplying contact region
semiconductor chip
20A pixel region
20B peripheral region
23 pixel
24 vertical drive circuit
25 column signal processing circuit
26 horizontal drive circuit
27 output circuit
28 control circuit
30 pixel drive line
31 vertical signal line
32 vertical signal line
33 logic circuit
34 bonding pad
35 readout circuit
40 semiconductor layer
41 well region
42 photoelectric-conversion-unit separation region
43 photoelectric conversion unit
50 multilayer wiring layer
51 interlayer insulating film
52 wire
59 support substrate
61 flattening film
62 light-shielding film
63 adhesive film
64 color filter layer
65 microlens
$\theta 8ax, \theta 8by$ inclination angle
$\theta 13ax, \theta 13by$ inclination angle AMP amplifier transistor
RST reset transistor
SEL selection transistor
TR transfer transistor

What is claimed is:

1. A semiconductor device, comprising:
a semiconductor layer having an active region demarcated by a separation region, wherein, in a plan view, the active region includes a first portion extending in a first direction and a second portion extending from the first portion in a direction crossing the first direction, and wherein the active region includes a channel region provided across the first portion and the second portion at an intersection between the first portion and the second portion; and
a field-effect transistor including:
a gate electrode on the channel region and overlapping the intersection of the first portion and the second portion;
a source region disposed in the first portion of the active region adjacent to a first side of the gate electrode; and
a drain region disposed in the second portion of the active region adjacent to a second side of the gate electrode opposite the first side.

2. The semiconductor device according to claim 1, further comprising:
a first channel boundary portion between the source region and the channel region; and
a second channel boundary portion between the drain region and the channel region, wherein each of the first and second channel boundary portions extends linearly.

3. The semiconductor device according to claim 1, further comprising:
a first channel boundary portion between the source region and the channel region; and
a second channel boundary portion between the drain region and the channel region, wherein the first channel boundary portion extends linearly and is orthogonal to an extending direction of the first portion, and wherein the second channel boundary portion extends linearly and is inclined with respect to an extending direction of the second portion.

4. The semiconductor device according to claim 1, further comprising:
a first channel boundary portion between the source region and the channel region; and
a second channel boundary portion between the drain region and the channel region, wherein the first and second channel boundary portions extend linearly parallel to each other.

5. The semiconductor device according to claim 1, wherein a first boundary portion between the source region and the channel region and a second boundary portion between the drain region and the channel region extend linearly and are inclined at 45 degrees with respect to respective extending directions of the first portion and the second portion in the active region.

6. The semiconductor device according to claim 1, wherein a length of a channel region inner boundary portion between an inner side of the channel region and the separation region and a length of a channel region outer boundary portion between an outer side of the channel region and the separation region are equivalent to each other.

7. The semiconductor device according to claim 2, wherein the first side of the gate electrode crosses the first portion in the plan view and the second side of the gate electrode crosses the second portion,
wherein the first channel boundary portion is formed by self-alignment with respect to a side of the first side of the gate electrode, and
wherein the second channel boundary portion is formed by self-alignment with respect to a side of the second side of the gate electrode.

8. The semiconductor device according to claim 1, wherein a part of the separation region in contact with an inner side of the channel region includes a semiconductor region provided in the semiconductor layer.

9. The semiconductor device according to claim 1, wherein the first portion and the second portion of the active region are orthogonal to each other.

10. The semiconductor device according to claim 1, further comprising:
a photoelectric conversion device that performs photoelectric conversion; and
a readout circuit that reads signal charges photoelectrically converted by the photoelectric conversion device, wherein at least one of a plurality of transistors included in the readout circuit includes the field-effect transistor.

11. An electronic apparatus, comprising:
a semiconductor device;
an optical lens that forms an image of image light from a subject on an imaging surface of the semiconductor device; and
a signal processing circuit that performs signal processing on a signal output from the semiconductor device, the semiconductor device including:
a semiconductor layer having an active region demarcated by a separation region, wherein, in a plan view, the active region includes a first portion extending in a first direction and a second portion extending from the first portion in a direction crossing the first direction, and wherein the active region includes a channel region provided across the first portion and the second portion at an intersection between the first portion and the second portion; and
a field-effect transistor including:
a gate electrode on the channel region and overlapping the intersection of the first portion and the second portion;
a source region disposed in the first portion of the active region adjacent to a first side of the gate electrode; and
a drain region disposed in the second portion of the active region adjacent to a second side of the gate electrode opposite the first side.

12. A semiconductor device, comprising:
a semiconductor layer having an active region demarcated by a separation region; and
a first transistor in which a pair of main electrode regions sandwiching a channel region are provided in the active region and a gate electrode is provided on the channel region,
wherein the active region includes a first portion extending in a first direction in a plan view, and a second portion extending from the first portion in a direction perpendicular to the first direction in the plan view,
wherein the channel region is provided across the first portion and the second portion,
wherein a first main electrode region of the pair of main electrode regions is provided in the first portion in contact with the channel region at a first side, and wherein a second main electrode region of the pair of main electrode regions is provided in the second portion in contact with the channel region at a second side opposite the first side.

13. The semiconductor device of claim 12, further comprising:
   a plurality of transistors including respective gates disposed on the active region.

14. The semiconductor device of claim 13, further comprising:
   a photoelectric conversion region, wherein the first transistor and the plurality of transistors are pixel transistors.

15. The semiconductor device of claim 14, wherein the plurality of transistors is three transistors.

16. The semiconductor device of claim 13, wherein the first portion and the second portion of the active region form a first corner of the active region, and wherein the active region includes second and third corners.

* * * * *